United States Patent
Huang

(10) Patent No.: US 12,191,158 B2
(45) Date of Patent: Jan. 7, 2025

(54) SEMICONDUCTOR DEVICE AND METHOD

(71) Applicant: Taiwan Semiconductor Manufacturing Co., Ltd., Hsinchu (TW)

(72) Inventor: Kuan-Wei Huang, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 509 days.

(21) Appl. No.: 17/513,708

(22) Filed: Oct. 28, 2021

(65) Prior Publication Data
US 2022/0367204 A1 Nov. 17, 2022

Related U.S. Application Data

(60) Provisional application No. 63/187,563, filed on May 12, 2021.

(51) Int. Cl.
*H01L 21/311* (2006.01)
*H01L 21/033* (2006.01)
*H01L 21/768* (2006.01)

(52) U.S. Cl.
CPC .... *H01L 21/31144* (2013.01); *H01L 21/0332* (2013.01); *H01L 21/0337* (2013.01); *H01L 21/31116* (2013.01); *H01L 21/76837* (2013.01)

(58) Field of Classification Search
CPC ........... H01L 21/31144; H01L 21/0332; H01L 21/0337; H01L 21/31116; H01L 21/76837; H01L 21/76816; H01L 21/76807
See application file for complete search history.

(56) References Cited

U.S. PATENT DOCUMENTS

| | | | | |
|---|---|---|---|---|
| 5,918,122 A * | 6/1999 | Parekh | ................. | H10B 12/033 257/E21.012 |
| 6,806,521 B2 * | 10/2004 | Yaung | ..................... | H01L 27/15 257/E33.044 |
| 7,183,150 B2 * | 2/2007 | Hsieh | ................ | H01L 21/31111 257/E21.267 |
| 2014/0193974 A1 * | 7/2014 | Lee | ..................... | H01L 21/0332 438/669 |
| 2016/0307793 A1 * | 10/2016 | Huang | .............. | H01L 23/53209 |
| 2018/0166330 A1 * | 6/2018 | Chu | .................. | H01L 21/31144 |

(Continued)

FOREIGN PATENT DOCUMENTS

TW   201923858 A   6/2019

*Primary Examiner* — Galina G Yushina
(74) *Attorney, Agent, or Firm* — Slater Matsil, LLP

(57) ABSTRACT

A method for manufacturing a semiconductor device includes depositing a first hard mask layer and a first dielectric layer over a substrate, forming a patterned layer over the first dielectric layer, forming a second hard mask layer over the patterned layer, patterning the second hard mask layer to remove first horizontal portions of the second hard mask layer and leave second portions of the second hard mask layer along sidewalls of the patterned layer, etching a trench in the first dielectric layer using the second portions of the second hard mask layer and the patterned layer as an etching mask, depositing a first gap-filling material in the trench and patterning the first hard mask layer using the first gap-filling material, the patterned layer, and the second portions of the second hard mask layer as a mask.

20 Claims, 16 Drawing Sheets

(56) References Cited

U.S. PATENT DOCUMENTS

2019/0035638 A1* 1/2019 Fan .................... H01L 21/0338
2019/0148159 A1 5/2019 Huang et al.
2019/0164759 A1* 5/2019 Huang ............ H01L 21/823475

* cited by examiner

SEMICONDUCTOR DEVICE AND METHOD

PRIORITY CLAIM AND CROSS-REFERENCE

This patent application claims priority to U.S. Provisional Application No. 63/187,563, filed on May 12, 2021 and entitled "LA Real First-Damage and CA Window Solution," which application is hereby incorporated by reference herein as if reproduced in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Multi-patterning is a technique used in the photolithographic process that defines the features of integrated circuits at advanced process nodes. It enables designers to develop integrated circuits using current optical lithography systems. In multi-patterning, a single photolithographic exposure may not be enough to provide sufficient resolution. Hence additional exposures are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
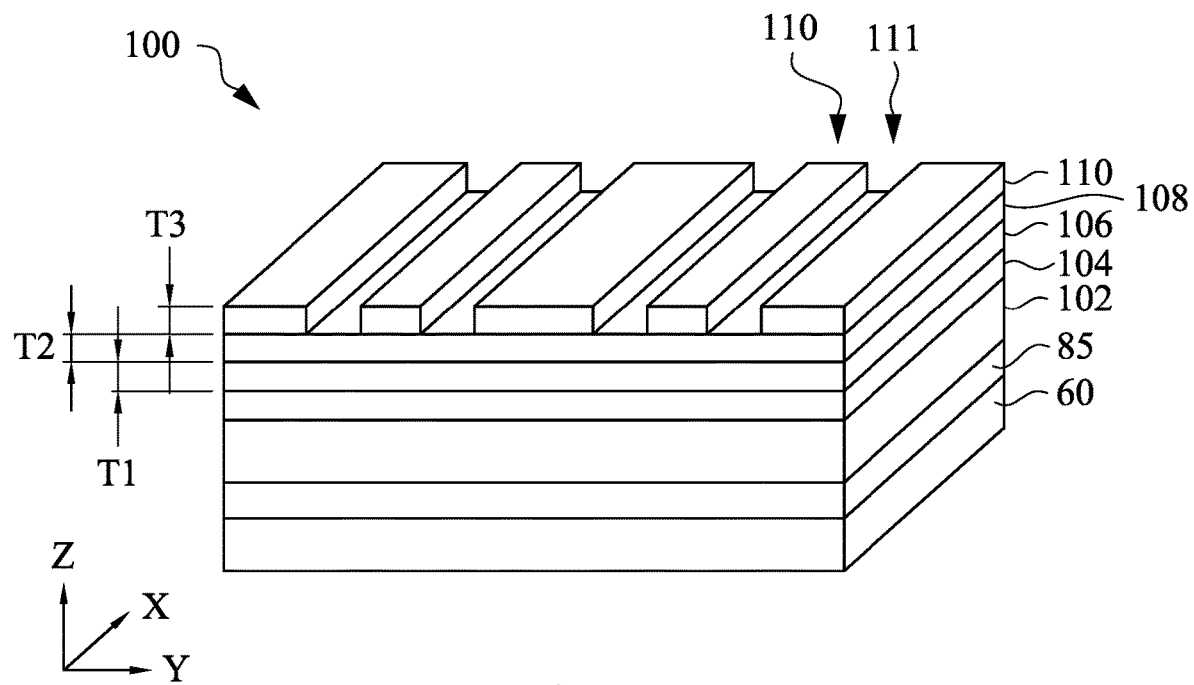
FIGS. 1, 2, 3, 4, 5, and 6A, illustrate perspective views of a hard mask at various initial stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to, but not limited to, the formation of a semiconductor device that includes depositing a patterned layer over a dielectric layer, followed by depositing a mask layer over the patterned layer to form a portion of a hard mask. An etching process is then used to pattern the mask layer to form first features (e.g., spacers) in a first (x-axis) direction along sidewalls of the patterned layer and form trenches in the dielectric layer by utilizing the first features and the patterned layer as an etching mask. Portions of the trenches are then filled with a film material that also functions as another portion of the hard mask for subsequent etching operations. Advantageous features of one or more embodiments disclosed herein may include allowing for a more uniform topography and controllable height of the film material, and reduction in damage to the first features of the mask layer as a result of less etching exposure. In addition, one or more embodiments disclosed herein may result in a reduction in damage to the patterned layer, thereby allowing for a hard mask that can better pattern underlying layers during the subsequent etching processes. Further, the chemistries of the embodiments are fully compatible with other semiconductor processes, and various embodiments can be manufactured at a relatively low cost.

FIGS. 1 through 14C illustrate a semiconductor structure 100 at various initial stages of fabrication, in accordance with an embodiment, oriented with respect to a first (x-axis) direction, a second (y-axis) direction, and a third (z-axis) direction.

The FIGS. 1 through 4 illustrate the formation of trenches 115 that are oriented in the first (x-axis) direction. In various embodiments, areas of the trenches 115 between sidewalls of spacers 113 define line patterns that are oriented in the first (x-axis) direction. For example, the line patterns may extend along and have longitudinal axises along the first direction. The line patterns may correspond with desired locations of patterned features (e.g., conductive material 130) subsequently formed in a target layer (see e.g., the first dielectric layer 102 of FIGS. 14A through 14C). FIG. 1 illustrates an example of a semiconductor structure 100 including dielectrics, photomasks, and other layers described below disposed over a substrate 60. FIG. 1 also includes the first dielectric layer 102 that is to be patterned. The substrate 60 may not be shown in each of the subsequent Figures. In some embodiments, semiconductor structure 100 is processed as part of a larger wafer. In such embodiments, after various features of the semiconductor structure 100 is formed (e.g., active devices, interconnect structures, and the like), a singulation process may be applied to scribe line regions of the wafer in order to separate individual semiconductor dies from the wafer (also referred to as singulation).

The substrate 60 may be a semiconductor substrate, such as a bulk semiconductor, a semiconductor-on-insulator (SOI) substrate, or the like, which may be doped (e.g., with a p-type or an n-type dopant) or undoped. The substrate 60 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 60 may include silicon; germanium; a compound semiconductor including silicon carbide, gallium arsenic, gallium phosphide, indium phosphide, indium arsenide, and/or indium antimonide; an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or combinations thereof.

The semiconductor substrate may further comprise an active layer (or device region) may include additional semiconductor, metal, and insulating or dielectric layers to form active devices such as transistors (e.g., Fin Field-Effect Transistors (FinFETs), Nanostructure Field-Effect Transistors (NSFETs), or the like) as well as passive devices such as resistors and capacitors. In some embodiments, contacts (also referred to as contact plugs), e.g., gate contacts and source/drain contacts, may be made formed to electrically connect to the active devices of the active layer. The contacts may be formed within an interlayer dielectric (ILD) that is formed of a suitable dielectric material such as phospho-silicate glass (PSG), boro-silicate glass (BSG), boron-doped phospho-silicate glass (BPSG), undoped silicate glass (USG), or the like.

As shown in FIG. 1, the semiconductor structure 100 may also include a plurality of etch stop layers, dielectric layers and hard mask layers, including an etch stop layer 85, a first dielectric layer 102, a second dielectric layer 104, a first hard mask layer 106, and a third dielectric layer 108.

The etch stop layer 85 maybe be formed over the substrate 60, and may comprise a dielectric material such as silicon oxynitride (SiON), silicon carbon oxynitride (SiCON), silicon carbide (SiC), silicon oxycarbide (SiOC), a combination thereof, or the like formed through chemical vapor deposition (CVD), physical vapor deposition (PVD), or the like. In some embodiments, the etch stop layer 85 may comprise a metal carbide (e.g., tungsten dicarbide), a metal nitride (titanium nitride), or the like, formed using a deposition process such as chemical vapor deposition (CVD), physical vapor deposition (PVD), atomic layer deposition (ALD), combinations of these, or the like.

After the formation of the etch stop layer 85, the first dielectric layer 102 may be formed over the etch stop layer 85. The first dielectric layer 102 (may also be referred to subsequently as target layer 102) is a layer in which a plurality of patterns is to be formed in accordance with embodiments of the present disclosure. In some embodiments, the first dielectric layer 102 is an inter-metal dielectric (IMD) layer. In such embodiments, the first dielectric layer 102 comprises a low-k dielectric material having a dielectric constant (k value) lower than 3.8, lower than 3.0, or lower than 2.5, for example. In some embodiments the first dielectric layer 102 may be made of one or more suitable dielectric materials such as silicon oxycarbohydride (SiOCH), other carbon doped oxides, extremely low-k dielectrics such as porous carbon doped silicon dioxide, silicon oxide ($SiO_2$), silicon nitride (SiN), a polymer such as polyimide, combinations of these, or the like. The first dielectric layer 102 may be formed through a process such as a spin-on process or CVD process, although any suitable process may be utilized. Openings may be patterned in the first dielectric layer 102 with the embodiment processes, and conductive lines and/or vias may be formed in the openings to form a back-end-of-line (BEOL) interconnect structure that may be used to connect device structures which have been fabricated on the substrate 60 during front-end-of-line (FEOL) processing.

In some embodiments, a second dielectric layer 104 is then formed over the first dielectric layer 102. The second dielectric layer 104 may be, e.g., an oxide formed from tetraethyl orthosilicate (TEOS), silicon nitride (SiN), silicon oxynitride (SiON), another nitrogen-free anti-reflective material, combinations, or these, or the like, although any suitable dielectric material may be used. The second dielectric layer 104 may be formed using a plasma enhanced chemical vapor deposition (PECVD) process, although other suitable processes, such as physical vapor deposition (PVD), or a thermal process, may be used. In some embodiments the second dielectric layer 104 may be an anti-reflective coating (ARC) formed over the first dielectric layer 102. In some embodiments the second dielectric layer 104 may be a nitrogen-free anti-reflective coating such as $SiO_x$ or $SiO_xC_y$, polymer based dielectrics, combinations of these, or the like, that may be formed using chemical vapor deposition (CVD), physical vapor deposition (PVD), atomic layer deposition (ALD), spin-coating, dip coating, or the like.

Once the second dielectric layer 104 has been formed, the first hard mask layer 106 may be formed over the second dielectric layer 104 to act as a hard mask. In some embodiments the first hard mask layer 106 may be formed of a material that comprises a metal (e.g., titanium nitride, titanium, tantalum nitride, titanium oxide, tantalum, a metal-doped carbide (e.g., tungsten dicarbide ($WC_2$), or the like) and/or a metalloid (e.g., silicon nitride, boron nitride, silicon carbide, or the like), and may be formed by Atomic Layer Deposition (ALD), physical vapor deposition (PVD), Radio Frequency PVD (RFPVD), chemical vapor deposition (CVD), or the like. In an embodiment, the first hard mask layer 106 is formed to a thickness T1, that is in a range from 80 Å to 300 Å. However, any suitable thickness may be utilized. In an embodiment, the first hard mask layer 106 may have a percentage carbon content that is in a range from 40 percent to 60 percent. In subsequent processing steps, a pattern is formed on the first hard mask layer 106 using an embodiment patterning process. The first hard mask layer 106 is then used as an etching mask for etching the first dielectric layer 102, where the pattern of the first hard mask layer 106 is transferred to the first dielectric layer 102. This pattern in the dielectric layer 102 may then be subsequently filled with a conductive material to form conductive vias and lines.

The third dielectric layer 108 may be formed over the first hard mask layer 106 as another hard mask. In some embodiments the third dielectric layer 108 may be, e.g., an oxide formed from tetraethyl orthosilicate (TEOS), silicon nitride (SiN), silicon oxynitride (SiON), another nitrogen-free anti-reflective material, combinations, or these, or the like, although any suitable dielectric material may be used. The third dielectric layer 108 may be formed using a plasma enhanced chemical vapor deposition (PECVD) process, although other suitable processes, such as physical vapor deposition or a thermal process, may be used. In an embodiment, the third dielectric layer 108 is formed to a thickness T2, that is in a range from 100 Å to 350 Å.

FIG. 1 additionally illustrates formation of a patterned layer 110 over the third dielectric layer 108. In some embodiments, the patterned layer 110 may comprise a patternable material such as amorphous silicon which is deposited and then patterned. In some embodiments, the patterned layer 110 may comprise silicon nitride (SiN), silicon oxide ($SiO_2$), or the like. In an embodiment, the patterned layer 110 is formed to a thickness T3, that is in a range from 150 Å to 500 Å. In an embodiments in which silicon is utilized, the patterned layer 110 may be deposited and then patterned using a photolithographic masking and etching process, whereby a photoresist (either by itself or as part of a tri-layer photoresist) is deposited, exposed, and developed, and then the photoresist is utilized as a mask during a anisotropic etching process that comprises chlorine ($Cl_2$), hydrogen bromide (HBr), carbon tetrafluoride ($CF_4$), or the like as an etching gas. However, any suitable material and method of manufacture and/or patterning can be utilized. In some embodiments, trenches 111 are formed extending along an x-direction by the patterning of the patterned layer 110 between portions of the patterned layer 110.

Figure 2:
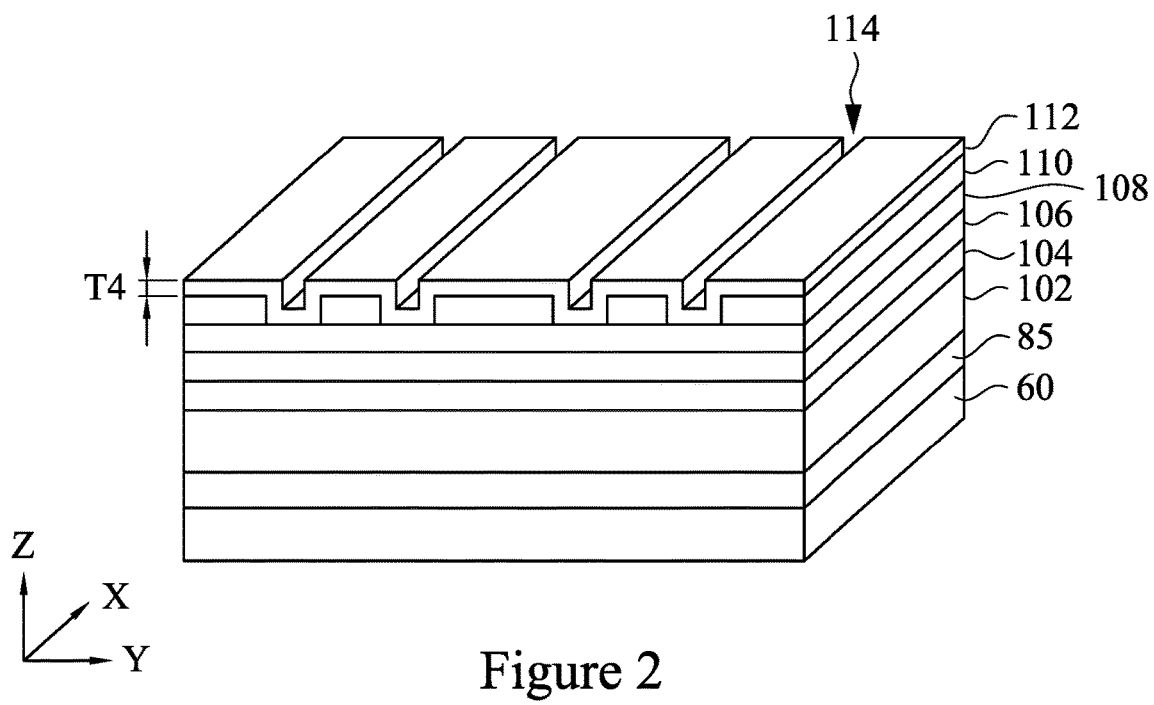

FIG. 2 illustrates the deposition of mask layer 112 over the patterned layer 110 that forms part of the hard mask features such as e.g. spacers 113 (not illustrated in FIG. 2 but illustrated and described below with respect to FIG. 3) for defining features in the first (x-axis) direction. In some embodiments, the mask layer 112 may be formed of a material such as titanium oxide (TiO), titanium nitride (TiN), titanium silicon oxide (TiSiO), or the like using a method such as chemical vapor deposition (CVD), physical vapor deposition (PVD), atomic layer deposition (ALD), combinations of these, or the like. However, any suitable material and method of manufacture may be utilized. In an embodiment, the mask layer 112 is formed to a thickness T4, that is in a range from 50 Å to 150 Å. In some embodiments, the mask layer 112 is deposited conformally over the trenches 111, forming trenches 114 in the mask layer 112 that extend along the x-direction.

Figure 3:
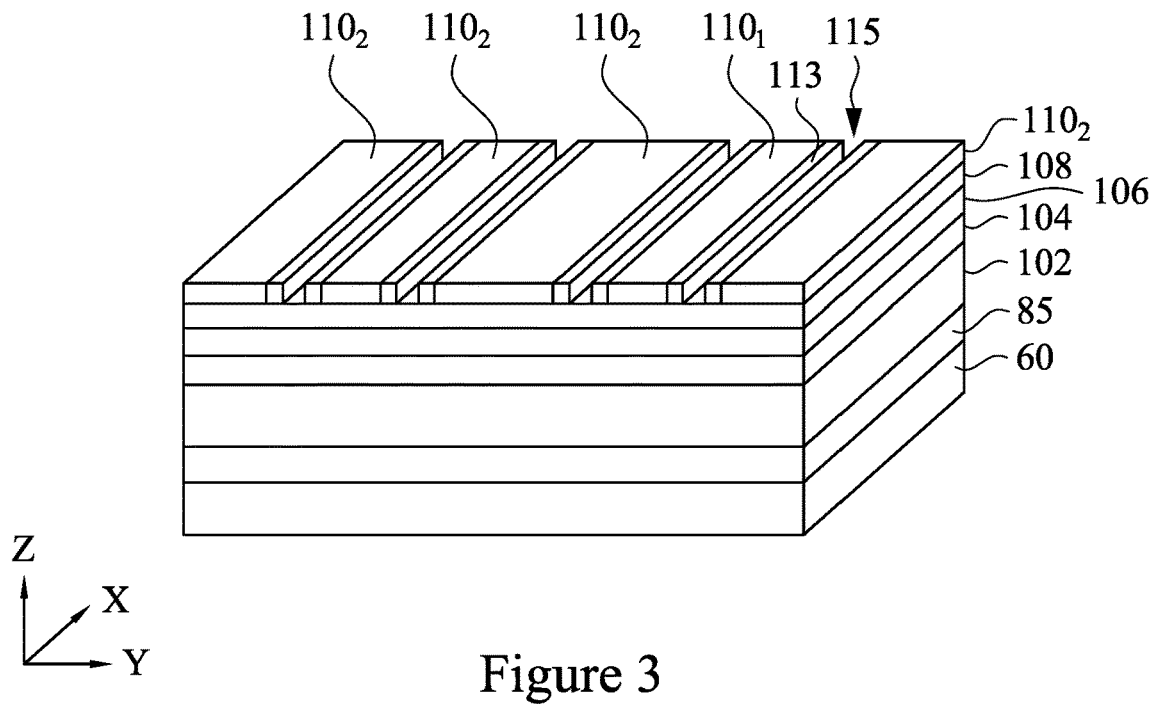

FIG. 3 illustrates an etching process to remove horizontal portions of the mask layer 112 over the patterned layer 110 and the third dielectric layer 108 to form trenches 115 extending along the x direction. Portions of the mask layer 112 remain along sidewalls of the patterned layer 110 to form spacers 113, while upper surfaces of the patterned layer 110 are exposed. If desired, certain portions of the patterned layer 110 may be identified as removable portions 1101 for removal so that the removable portions 1101 are not available for use as a mask in subsequent etching processes (described further below with respect to FIGS. 10A and 10B). Additionally, other portions of the patterned layer 110 may be identified as remaining portions 1102 so that the remaining portions 1102 remain and are available for use as a mask in subsequent etching processes.

In some embodiments, the etching process may be an anisotropic etching process using an etchant such as $C_xF_y$, $C_xH_yF_z$, or $C_xH_yCl_z$ based gas. In an embodiment, the etchant may comprise carbon tetrafluoride ($CF_4$), trifluoromethane ($CHF_3$), difluoromethane ($CH_2F_2$), hexafluorobutadiene ($C_4F_6$), or the like. In an embodiment, the etching process may include flowing a carrier gas such as nitrogen ($N_2$), helium (He), argon (Ar), or the like However, any suitable etching process may be utilized.

Figure 4:
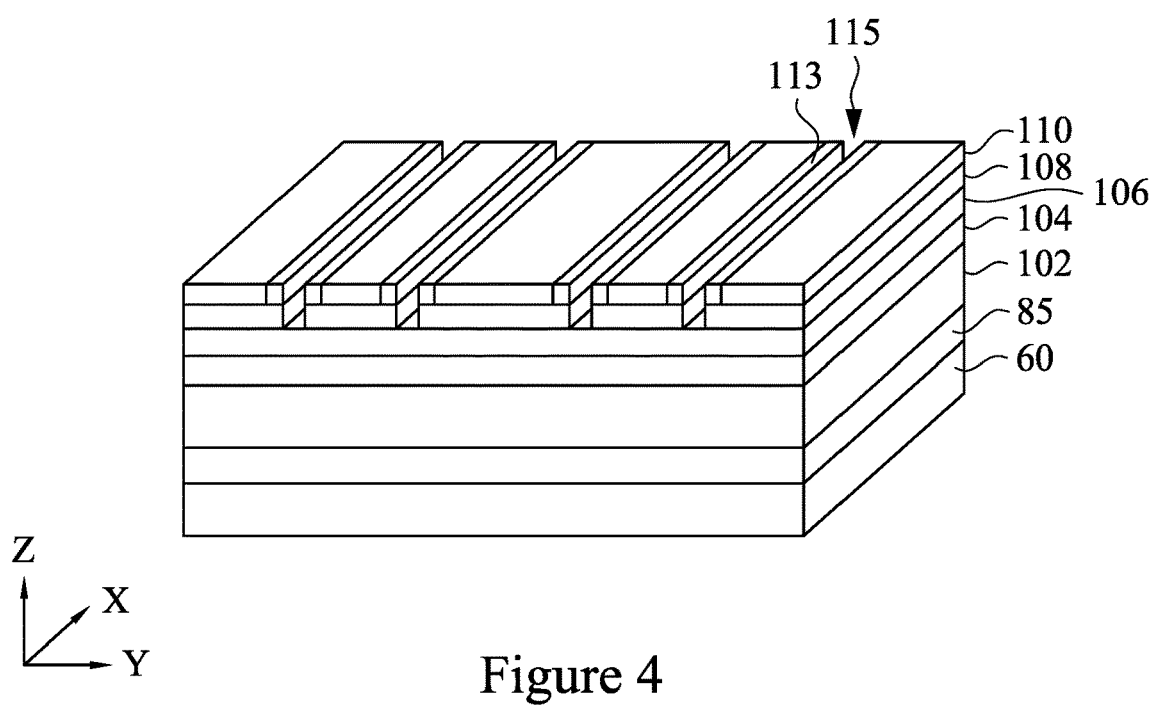

FIG. 4 illustrates an etching process to remove portions of the third dielectric layer 108 using spacers 113 and the patterned layer 110 as an etching mask. The etching process extends the trenches 115 through the third dielectric layer 108. In some embodiments, the etching process may be an anisotropic etching process such as a dry etching process. In an embodiment, any suitable etching process may be utilized, such as wet etching processes or dry etching processes. In an embodiment, the etching process may utilize an etchant that comprises carbon tetrafluoride ($CF_4$), trifluoromethane ($CHF_3$), difluoromethane ($CH_2F_2$), hexafluorobutadiene ($C_4F_6$), or the like. In an embodiment, the etching process may include flowing a carrier gas such as nitogen ($N_2$), helium (He), argon (Ar), or the like. In an embodiment, a continuous etching process may be used to form the trenches 115 (described in FIG. 3 above) and to further extend the trenches 115 (described in FIG. 4), and the continuous etching process may comprise any of the etchants and carrier gases discussed in FIGS. 3 and 4. An advantage of using a continuous etching process to form the spacers 113 and the trenches 115 in the third dielectric layer 108 is a reduction to etching exposure of the spacers 113 and the patterned layer 110 (e.g., if the third dielectric layer 108 is etched at a later stage instead) which reduces possible damage to the spacers 113 and the patterned layer 110 and improves patterning performance.

In FIGS. 5 through 9D, a patterned sacrificial material (e.g., the first film material 122) is formed in selected portions of the trenches 115. In particular, the first film material 122 is deposited in select areas of the line patterns (areas between sidewalls of spacers 113, shown in FIG. 4). The first film material 122 may be used to further define a desired pattern in the second (y-axis) direction for etching the target layer 102. For example, the first film material 122 may be deposited to define areas where patterned features (e.g., conductive material 130) are not formed (e.g., cut) in the target layer 102 (see e.g., FIGS. 14A through 14C).

Figure 5:
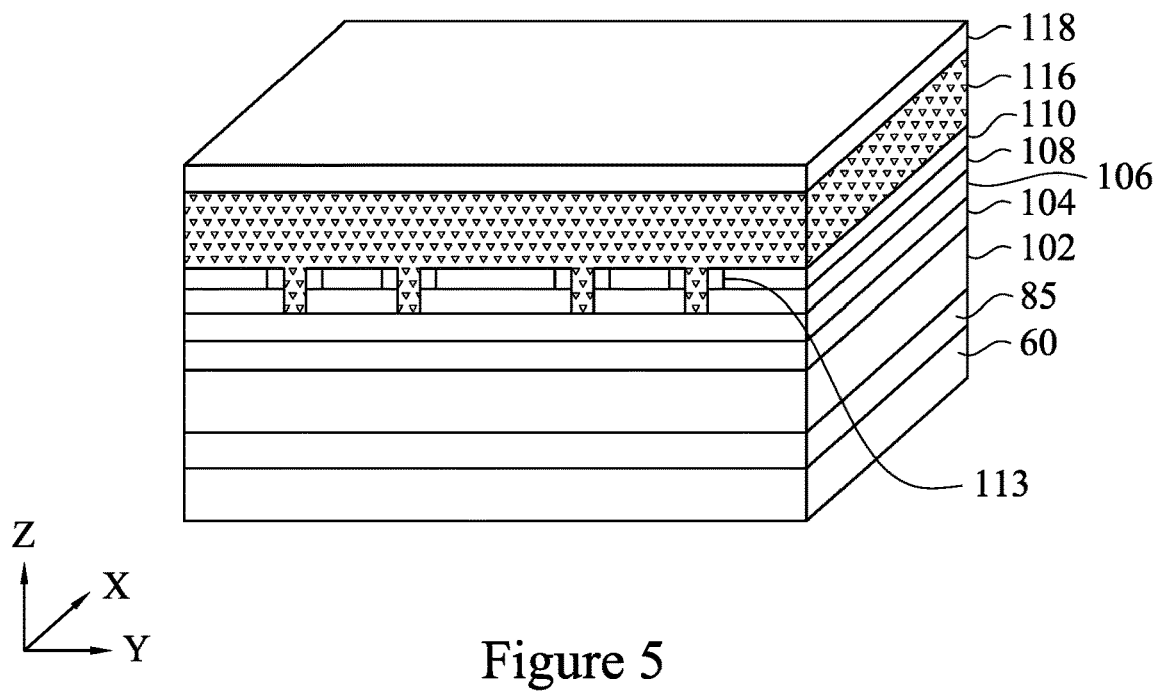

FIG. 5 illustrates the deposition of a first photomask layer 116 and a second photomask layer 118 over the spacers 113, the patterned layer 110, and in the trenches 115. In some embodiments, the first photomask layer 116 may be a bottom layer of a multi-layer photoresist, and may comprise an organic or inorganic material that has an etch selectivity to the second photomask layer 118. As such, the second photomask layer 118 can be used as a mask layer to pattern the first photomask layer 116. In an embodiment, a thickness of the first photomask layer 116 may be in a range from 350 Å to about 1500 Å. In an embodiment, a thickness of the second photomask layer 118 may be in a range from 100 Å to 400 Å. The total thickness of the first photomask layer 116 and the second photomask layer 118 may be in a range from 350 Å to 1500 Å.

The second photomask layer 118 may comprise a photosensitive material by itself or, in other embodiments, may be a bi-layer structure with a photosensitive material over another, middle layer of material such as silicon nitride, silicon oxynitride, silicon oxycarbide (SiOC), or the like to form a tri-layer photoresist along with the first photomask layer 116. Any suitable deposition method, such as physical vapor deposition (PVD), chemical vapor deposition (CVD), spin coating, the like, or combinations thereof, may be used to form second photomask layer 118.

Figure 6A:
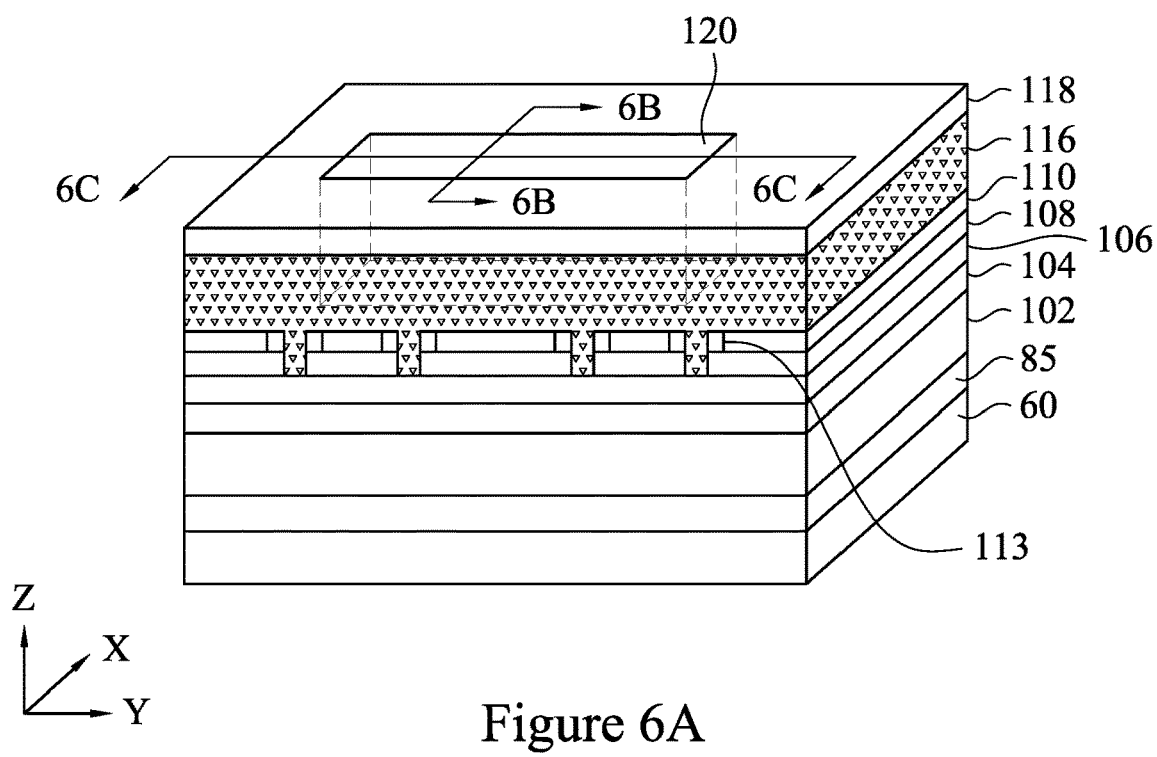
Figure 6B:
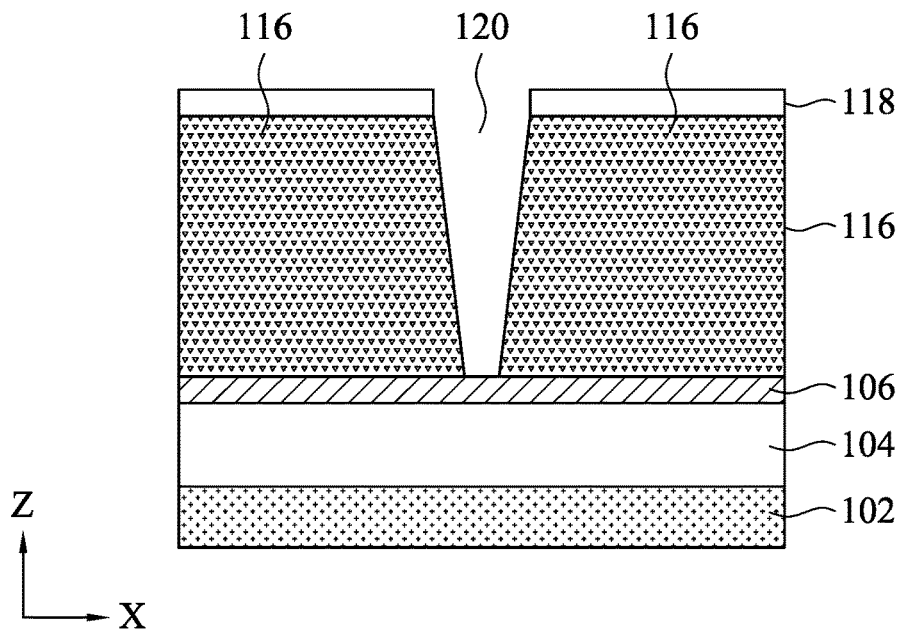
FIGS. 6B and 6C illustrate cross-sectional views of the hard mask at various intermediate stages of fabrication, in accordance with some embodiments.
Figure 6C:
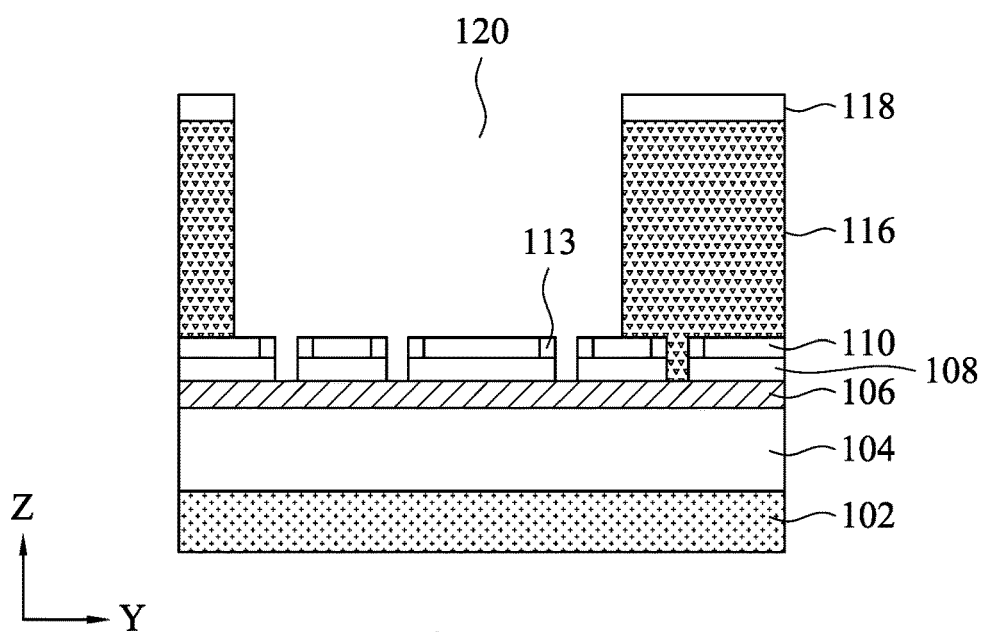

In FIGS. 6A through 6C, openings 120 (sometimes referred to as cuts) are formed in the second photomask layer 118. Although one openings 120 is illustrated, it should be understood that any number of openings 120 may be formed. FIG. 6B shows a cross-sectional view of a portion of the semiconductor structure 100 along line 6B-6B from FIG. 6A (with layers located below the first dielectric layer 102 being excluded from FIG. 6B for clarity) in the x-z plane. FIG. 6C shows a cross-sectional view of a portion of the semiconductor structure 100 along line 6C-6C from FIG. 6A (with layers located below the first dielectric layer 102 being excluded from FIG. 6C for clarity) in the y-z plane.

In some embodiments, the second photomask layer 118 may be patterned by exposing the photosensitive material within the second photomask layer 118 to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the second photomask layer 118 are different from the physical properties of the unexposed portions of the second photomask layer 118. The second photomask layer 118 may then be developed with, e.g., a developer, in order to separate the exposed portion of the second photomask layer 118 from the unexposed portion of the second photomask layer 118.

Next, the openings 120 in the second photomask layer 118 is extended through the bottom first photomask layer 116 (or the bottom first photomask layer 116 and the middle layer when the middle layer is present), using, for example, one or more anisotropic etching processes. In some embodiments, the openings 120 is extended all of the way through the first photomask layer 116 so as to expose the first hard mask layer 106. As such, the extension of the openings 120 forms a trench in the first photomask layer 116 and the second photomask layer 118. In an alternate embodiment, when the openings 120 are extended through the first photomask layer 116, top portions of the first hard mask layer 106 may also be partially etched and hence the openings 120 may extend partially into the first hard mask layer 106. In some embodiments, top portions of the spacers 113 and the patterned layer 110 may be etched as well.

Figure 7A:
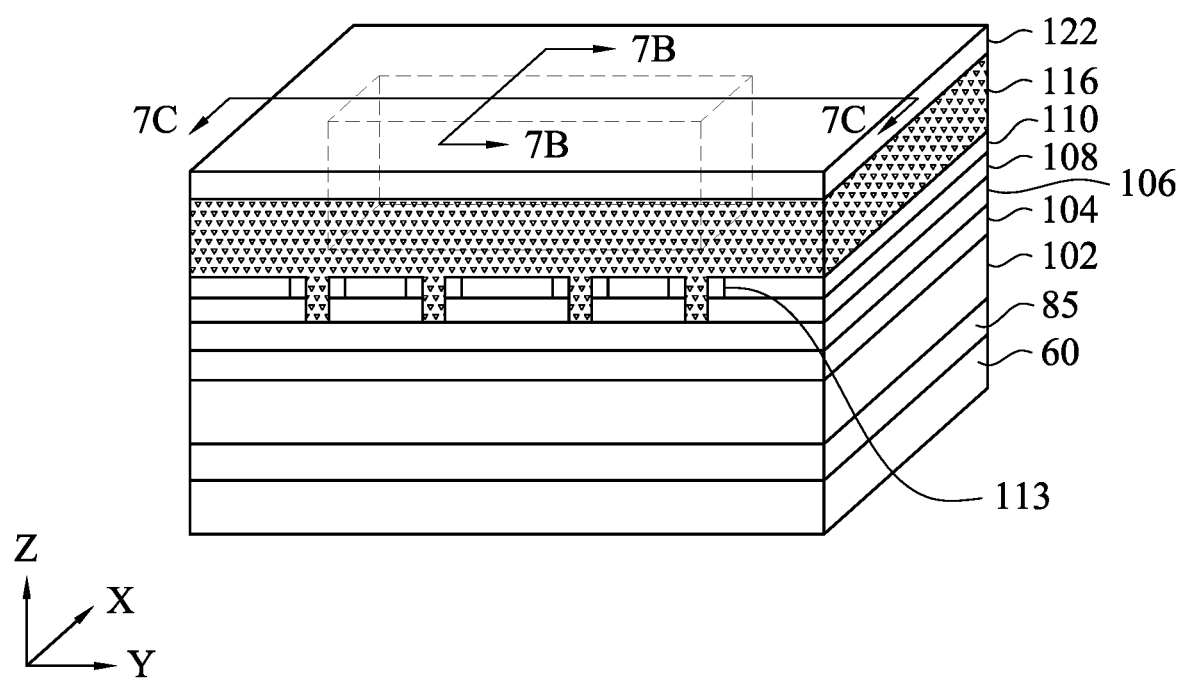
FIGS. 7A, 7B, 7C, 8A, 8B, 9A, 9B, 9C, 9D, 9E and 10A illustrate perspective and cross-sectional views of the hard mask at various intermediate stages of fabrication, in accordance with some embodiments.
Figure 7B:
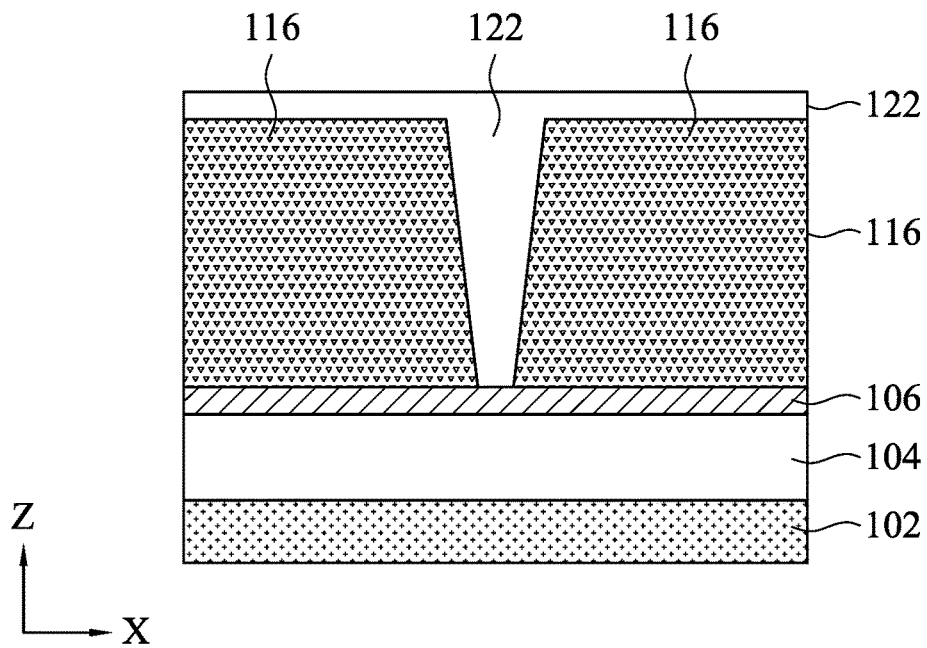
Figure 7C:
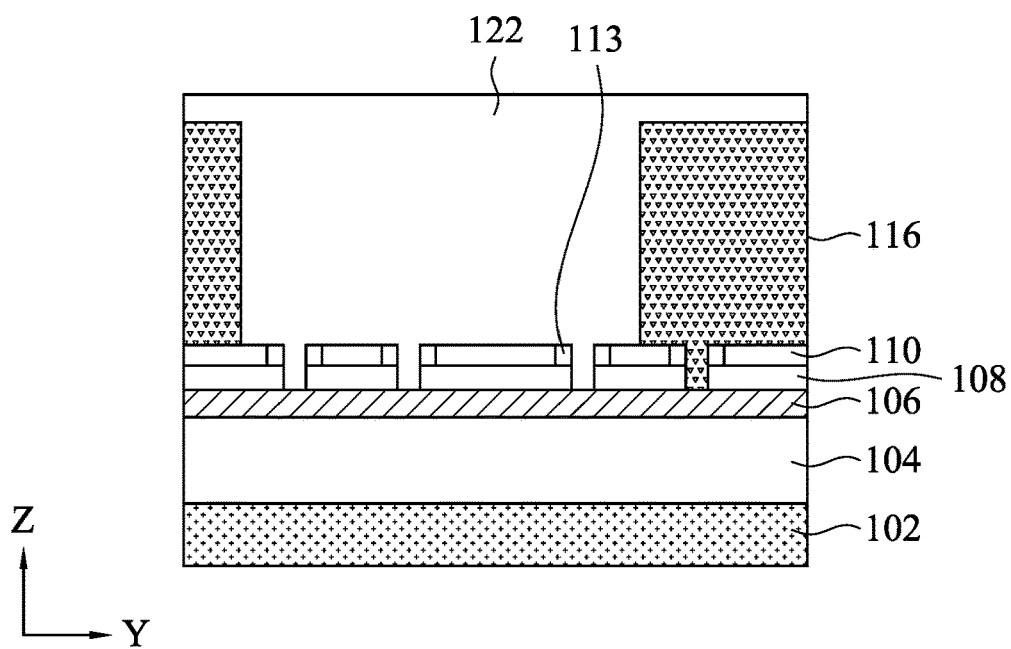

FIGS. 7A through 7C illustrate the formation of a first film material 122 in the openings 120 and over the bottom first photomask layer 116, in accordance with some embodiments. FIG. 7B shows a cross-sectional view of a portion of the semiconductor structure 100 along line 7B-7B from FIG. 7A (with layers located below the first dielectric layer 102 being excluded from FIG. 7B for clarity) in the x-z plane. FIG. 7C shows a cross-sectional view of a portion of the semiconductor structure 100 along line 7C-7C from FIG. 7A (with layers located below the first dielectric layer 102 being excluded from FIG. 7C for clarity) in the y-z plane. In some embodiments, prior to depositing the first film material 122, the second photomask layer 118 is removed using, for example one or more ashing or etching processes. Subsequently, the first film material 122, which may also be referred to as a gap-filling material 122 or a reverse material 122, is deposited into the openings 120 in order to achieve improved etch selectivity for subsequent etching processes.

In some embodiments, the composition of the first film material 122 can be silicon oxide ($SiO_x$), silicon carbon oxide ($SiC_xO_y$), silicon nitride (SiN), a metal oxide or metal nitride such as e.g. titanium oxide (TiO), aluminum oxide ($Al_2O_3$), or titanium nitride (TiN), the like, or a combination thereof. In an embodiment, the first film material 122 may comprise a carbon based material deposited using a spin-coating process. The first film material 122 can be deposited using a deposition process such as atomic layer deposition (ALD), chemical vapor deposition (CVD), or physical vapor deposition (PVD). In some embodiments, in which the first film material 122 is formed using an atomic layer deposition (ALD) process, the atomic layer deposition (ALD) process may utilize a series of repeated cycles whereby a first precursor is pulsed into a deposition chamber to react with the first photomask layer 116, the first precursor is purged, a reaction gas is pulsed into the deposition chamber to react with the first precursor, the reaction gas is purged, and the cycle is repeated. In an embodiment the first film material may comprise silicon oxide ($SiO_2$) formed using a low temperature atomic layer deposition (ALD) process. The depositing process may be a gap filling process, such that portions of the first film material 122 are deposited on sidewalls of the openings 120 until they merge together along a seam (not explicitly illustrated). In an embodiment, the etch selectivity ratio between the first hard mask layer 106 and the first film material 122 may be higher than 6, for example, for achieving smaller features without defects.

Figure 8A:
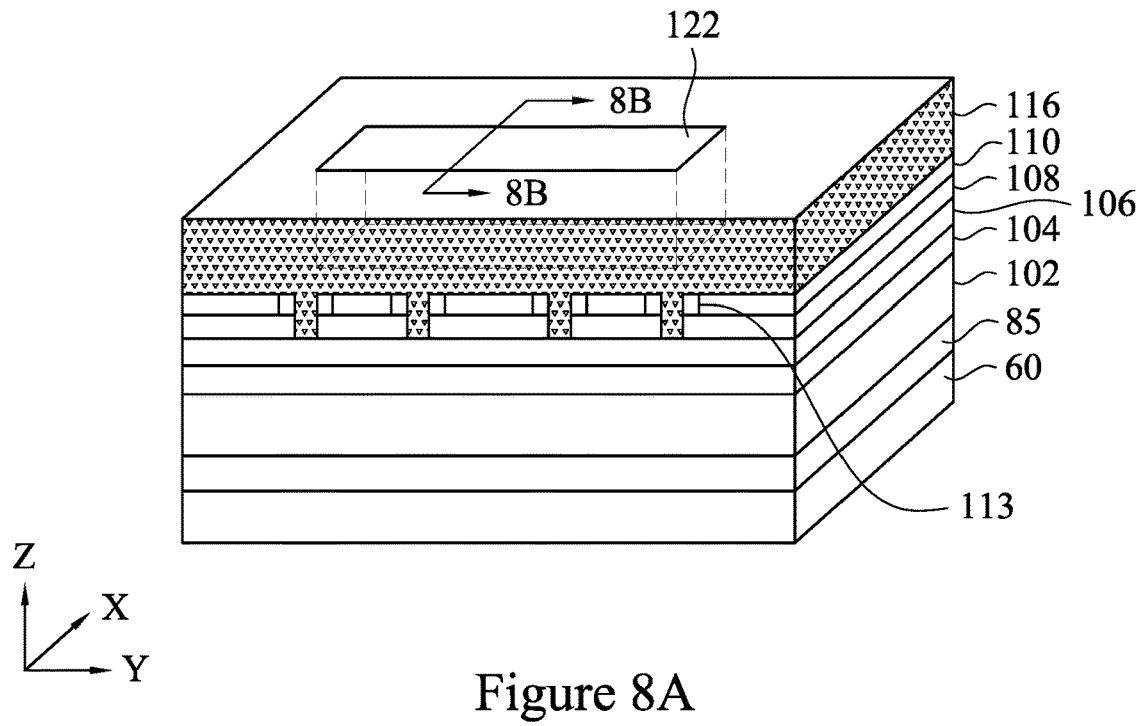
Figure 8B:
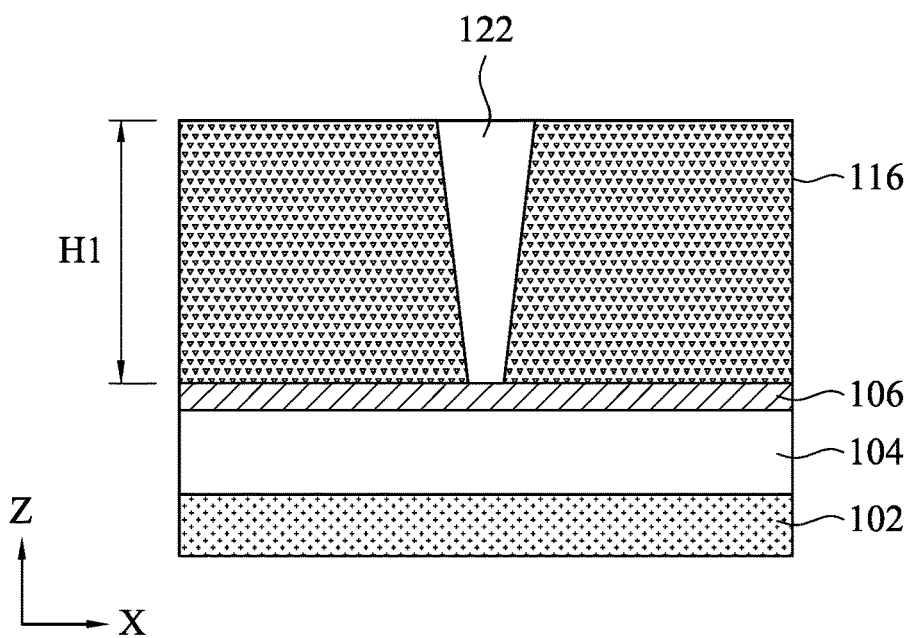

FIGS. 8A and 8B illustrate a removal process to remove excess materials of the first film material 122 over the first photomask layer 116. FIG. 8B shows a cross-sectional view of a portion of the semiconductor structure 100 along line 8B-8B from FIG. 8A (with layers located below the first dielectric layer 102 being excluded from FIG. 8B for clarity) in the x-z plane. In some embodiments, the removal process may be performed using a chemical-mechanical polishing (CMP) step or an etching step (e.g., one or more anisotropic etching process using an etchant that comprises a $C_xF_y$/ $C_xH_yF_z$ based gas) to planarize the surface of the first photomask layer 116 as well as the upper surfaces of the first film material 122. However, any suitable removal process may be utilized. In some embodiments, the height of the first film material 122 can be reduced to be at least co-planar with a top surface of the first photomask layer 116. In an embodiment, after the removal process to remove excess materials of the first film material 122 over the first photomask layer 116, the first film material 122 may have a height H1 that is in a range from 300 Å to 1300 Å.

Figure 9A:
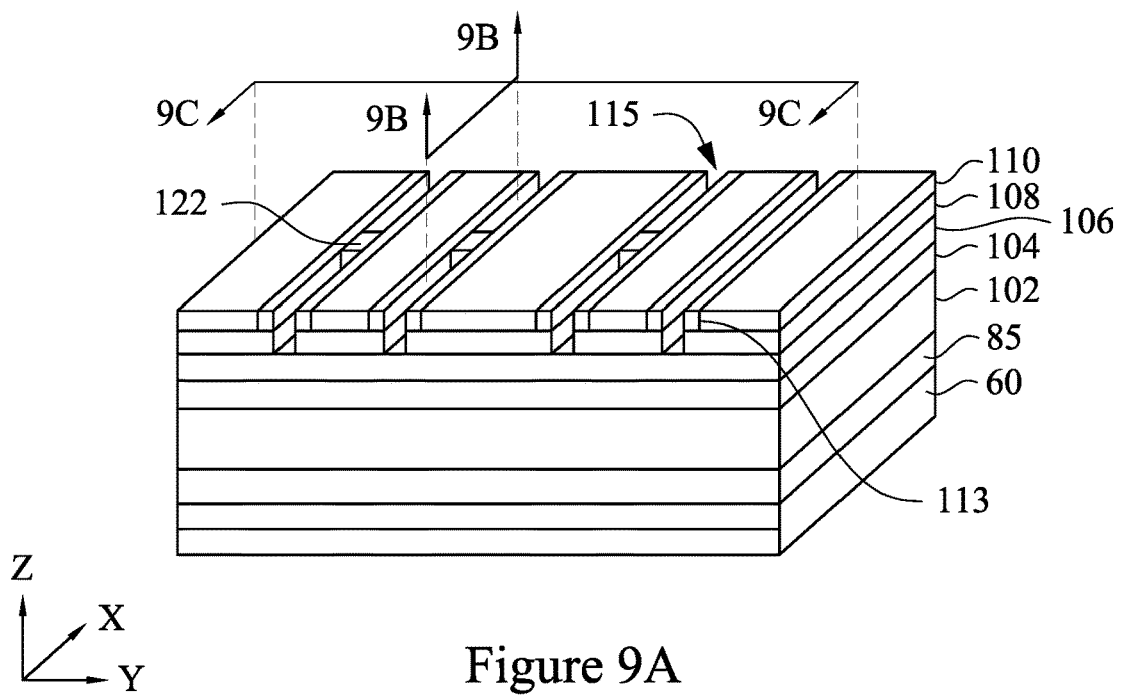
Figure 9B:
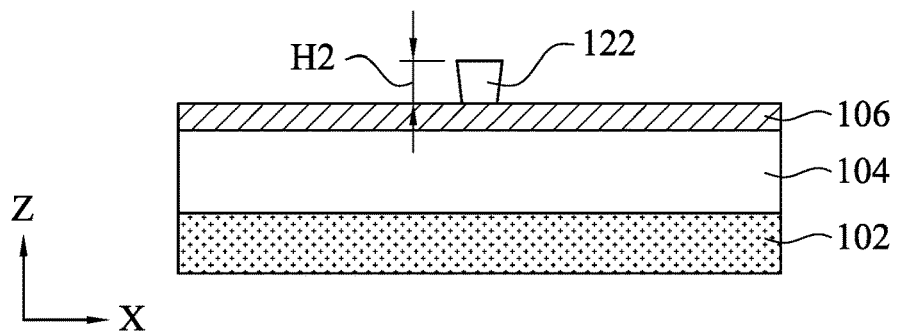
Figure 9C:
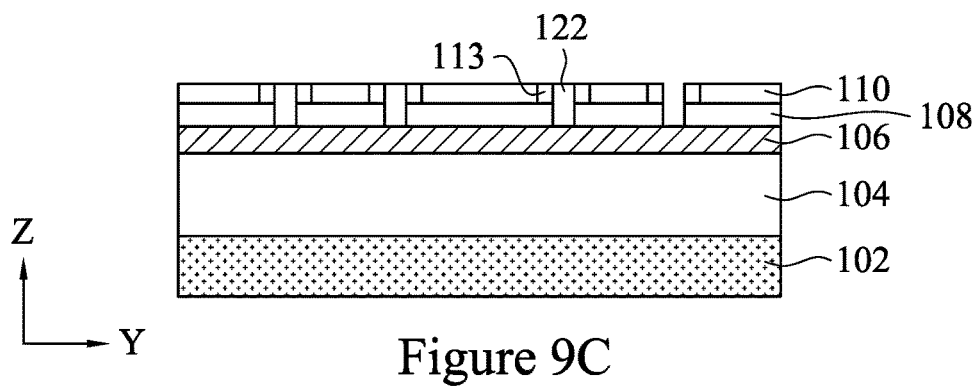
Figure 9D:
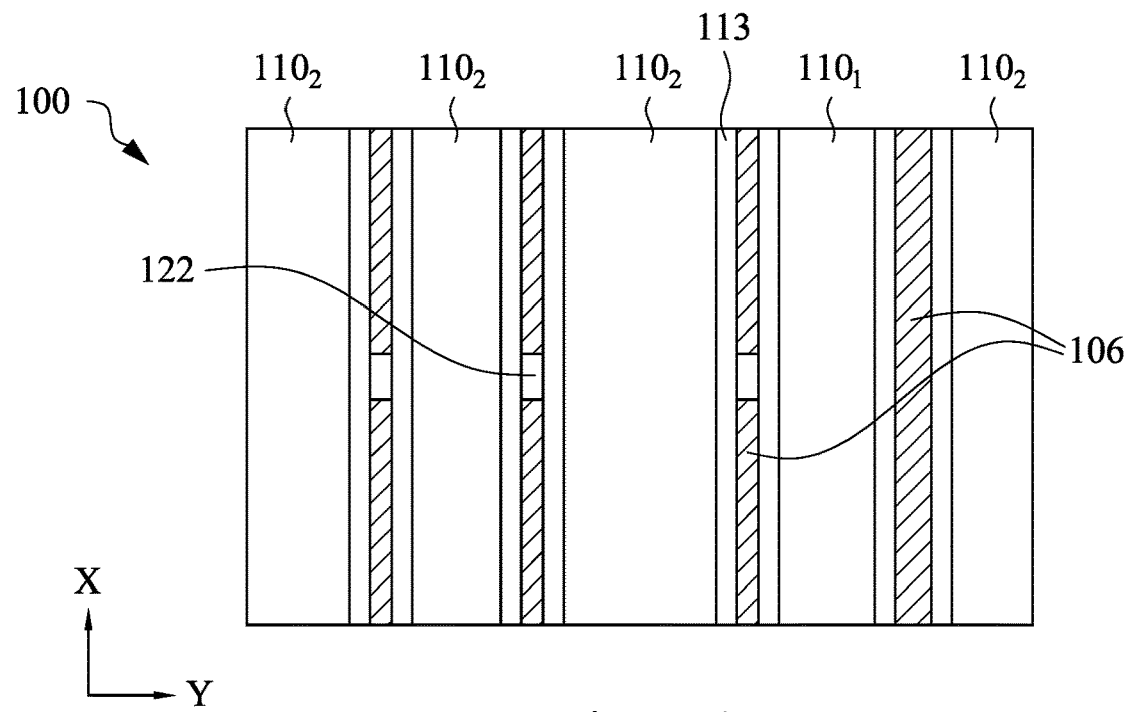
Figure 9E:
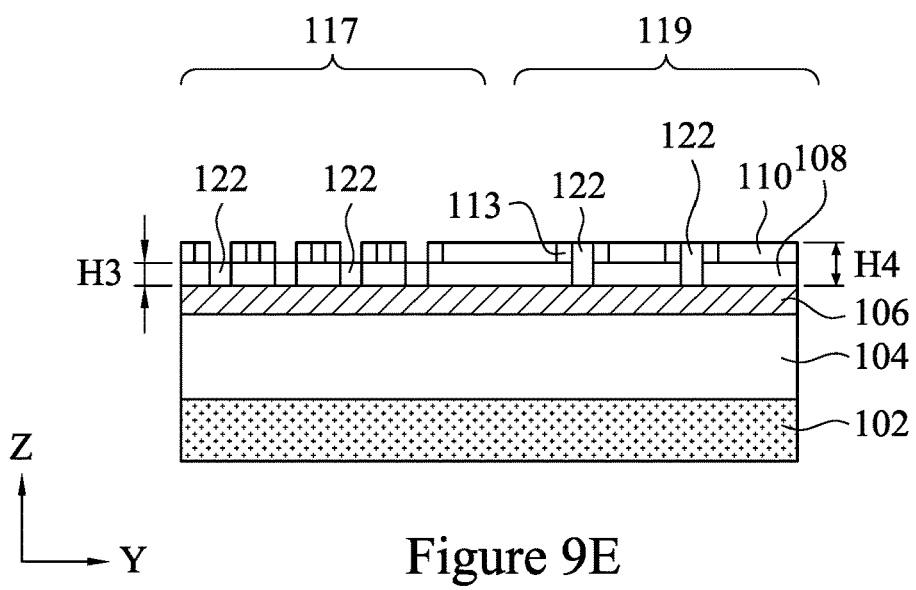

FIGS. 9A through 9D illustrate the removal of the first photomask layer 116 and a portion of the first film material 122. FIG. 9B illustrates a cross-sectional view of a portion of the semiconductor structure 100 along line 9B-9B (with layers located below the first dielectric layer 102 being excluded from FIG. 9B for clarity) from FIG. 9A. FIG. 9C illustrates a cross-sectional view of a portion of the semiconductor structure 100 along line 9C-9C (with layers located below the first dielectric layer 102 being excluded from FIG. 9C for clarity) from FIG. 9A. FIG. 9D shows a top-down view of FIG. 9A. In an embodiment, a portion of the first film material 122 remains in one or more of the trenches 115 and will act as a hard mask during the following processing steps. The remaining portion of the first film material 122 may be used to further define a desired pattern in the second (y-axis) direction for etching the target layer 102. In some embodiments, the removal may be performed with one or more ashing or etching steps using etchants that comprise oxygen ($O_2$) based gas. In a particular embodiment the first photomask layer 116 may be removed using an ashing process. However, any suitable removal processes, such as a wet etching process, may also be utilized. Before the removal of the first photomask layer 116 and the portion of the first film material 122, the first film material 122 may have the height H1 (shown previously in FIG. 8B) that is in a range from 300 Å to 1300 Å. After the removal of the first photomask layer 116 and the portion of the first film material 122, the remaining portion of the first film material 122 may have a height H2 that is in a range from 50 Å to 400 Å. In some embodiments, after the removal process, heights of the first film material 122 that remain may be different in areas having different patterned layer 110 and third dielectric layer 108 pattern densities. For example, FIG. 9E shows a region 117 that has a higher patterned layer 110 and third dielectric layer 108 density than a region 119. After the removal process of the first photomask layer 116 and the portion of the first film material 122, a height H3 of the first film material 122 in the region 117 is smaller than a height H4 of the first film material 122 in the region 119.

Figure 10A:
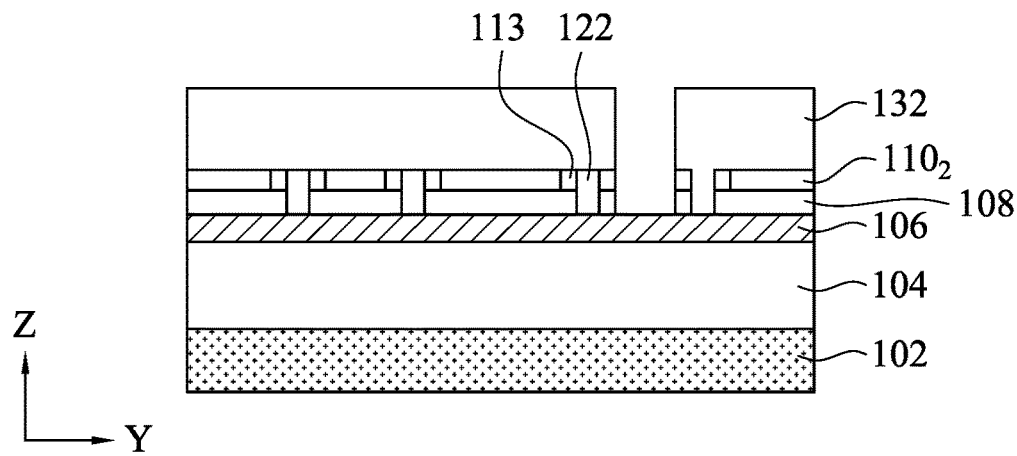
Figure 10B:
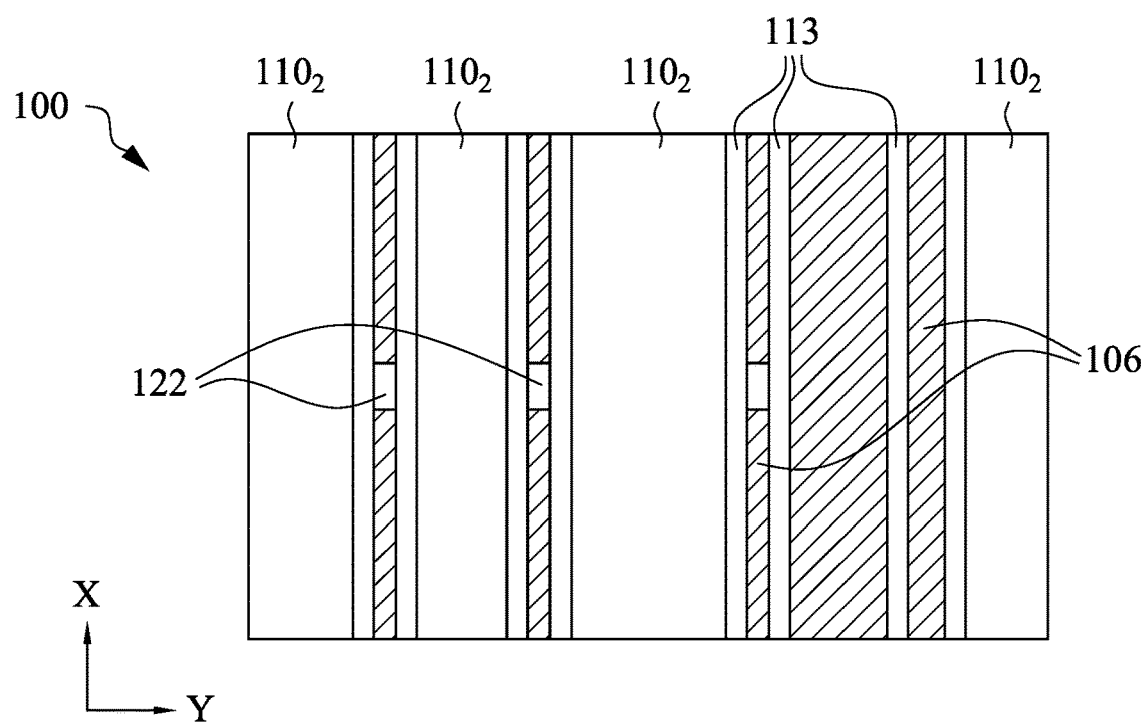
FIGS. 10B, 11A, 11B, 11C, 12A, 12B, 12C, 13A, 13B, 14A, 14B and 14C illustrate top-down views and cross-sectional views of the hard mask and a patterned layer beneath the hard mask at various final stages of fabrication, in accordance with some embodiments.

In FIGS. 10A and 10B, the removable portions 1101 of the patterned layer 110 are removed. In addition, portions of the third dielectric layer 108 below the removable portions 1101 of the patterned layer 110 are also removed. FIG. 10A illustrates a cross-sectional view of a portion of the semiconductor structure 100 along line 9C-9C from FIG. 9A (with layers located below the first dielectric layer 102 being excluded from FIG. 10A for clarity). FIG. 10B shows a top-down view of the semiconductor structure 100 after the removable portions 1101, and the portions of the third dielectric layer 108 below the removable portions 1101 are removed. In some embodiments, the removable portions 1101 are removed by initially placing and patterning a photoresist 132 (shown in FIG. 10A) so that the photoresist 132 covers and protects the remaining portions 1102 and the spacers 113 while exposing the removable portions 1101. Once the remaining portions 1102 are protected, the removable portions 1101, and the portions of the third dielectric layer 108 below the removable portions 1101 are then removed using one or more etching processes, such as wet etching processes or dry etching processes. In an embodiment, the etching process may utilize an etchant that comprises carbon tetrafluoride ($CF_4$), trifluoromethane ($CHF_3$), difluoromethane ($CH_2F_2$), hexafluorobutadiene ($C_4F_6$), or the like. In an embodiment, the etchant process may include flowing a carrier gas such as nitrogen ($N_2$), helium (He), argon (Ar), or the like. After the removable portions 1101, and the portions of the third dielectric layer 108 below the removable portions 1101 are removed, the photoresist 132 is removed using, for example, an ashing process (shown in FIG. 10B).

Figure 11A:
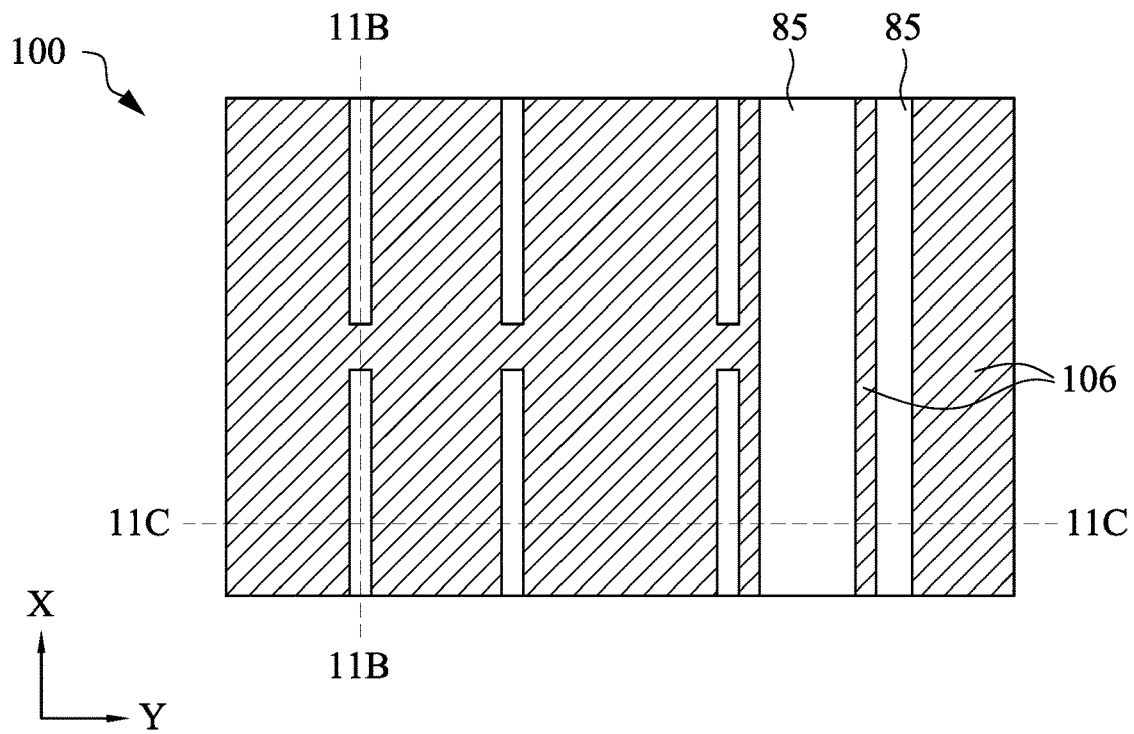
Figure 11B:
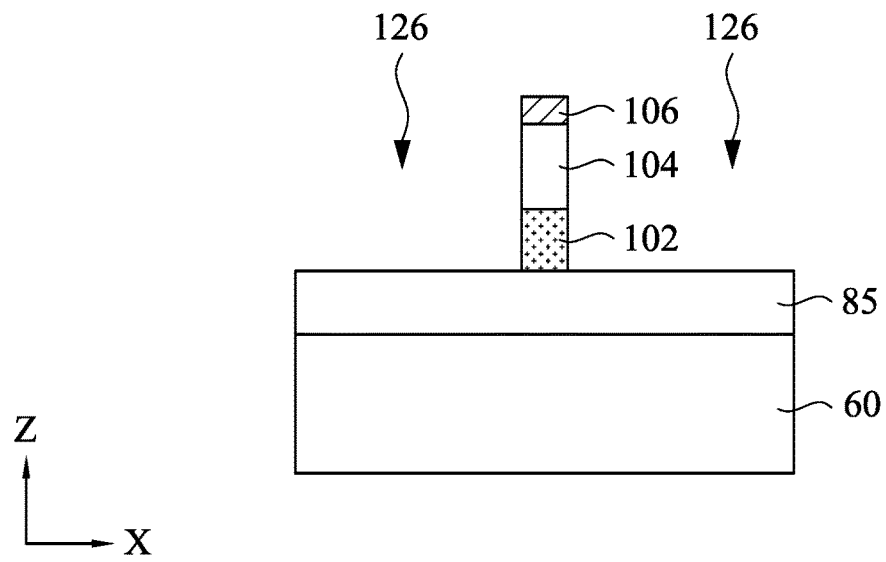
Figure 11C:
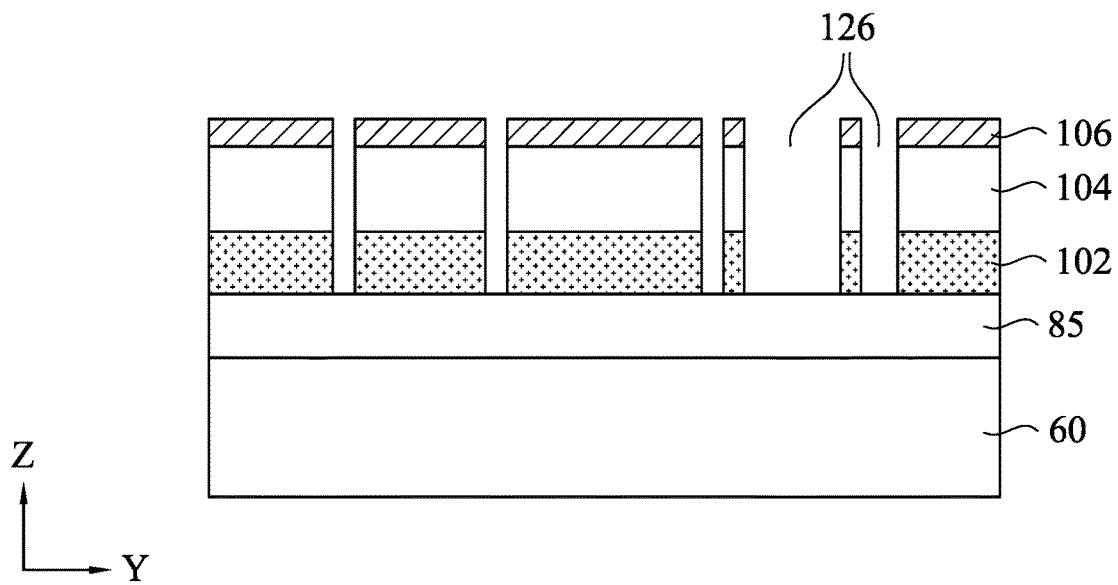

FIGS. 11A through 11C illustrate that once the removable portions 1101 of the patterned layer 110 have been removed, the remaining portions 1102, the first film material 122 and the spacers 113 are utilized to pattern the first hard mask layer 106, the second dielectric layer 104, and the first dielectric layer 102 to form openings 126. FIG. 11A shows a top-down view of the semiconductor structure 100 after the patterning of the first hard mask layer 106, the second dielectric layer 104, and the first dielectric layer 102 to form openings 126. FIG. 11B illustrates a cross-sectional view of a portion of the semiconductor structure 100 along line 11B-11B from FIG. 11A. FIG. 11C illustrates a cross-sectional view of a portion of the semiconductor structure 100 along line 11C-11C from FIG. 11A. As described above in FIG. 1, the second dielectric layer 104 may serve as an anti-reflective coating (ARC) formed over the first dielectric layer 102. The first dielectric layer 102 may also referred to as the target layer 102. The patterning process results in openings 126 being formed in the first dielectric layer 102, the second dielectric layer 104, and the first hard mask layer 106. Subsequently, conductive lines and/or vias may then be formed in the openings 126 in the target layer 102 (shown in FIGS. 14A through 14C below). In some embodiments, the pattern may be transferred using one or more dry etching processes, which may be anisotropic etching processes. However, any suitable etching process may be utilized. In an embodiment, the first hard mask layer 106 is patterned using an etching process that comprises chlorine ($Cl_2$), nitrogen trifluoride ($NF_3$), hydrogen bromide (HBr), or the like, as etching gases. In an embodiment, the second dielectric layer 104 is patterned using an etching process that comprises carbon tetrafluoride ($CF_4$), trifluoromethane ($CHF_3$), hexafluorobutadiene ($C_4F_6$), octafluorocyclobutane ($C_4F_8$) or the like, as etching gases. In an embodiment, the first dielectric layer 102 is patterned using an etching process that comprises carbon tetrafluoride ($CF_4$), trifluoromethane ($CHF_3$), hexafluorobutadiene ($C_4F_6$), octafluorocyclobutane ($C_4F_8$) or the like, as etching gases. The etching process to pattern the first dielectric layer 102 and the second dielectric layer 104 may be continuous. The patterning of the first hard mask layer 106, the second dielectric layer 104, and the first dielectric layer 102 stops when the etch stop layer 85 is reached. Advantages can be achieved as a result of an etching process that patterns the mask layer 112 to form spacers 113 and forms the trenches 115 in the third dielectric layer 108, and then subsequently filling portions of the trenches 115 with the first film material 122 to function as a portion of a hard mask for subsequent etching operations. Because the first film material 122 is formed in the trenches 115 after the spacers 113 are formed, this allows for the first film material 122 to have a more uniform topography and controllable height. In addition, since the etch selectivity ratio between the first hard mask layer 106 and the first film material 122 is higher than 6, this may be useful for achieving smaller features without defects. Further, because a continuous etching process is used to form the spacers 113 and the trenches 115 in the third dielectric layer 108, this reduces etching exposure of the spacers 113 and the patterned layer 110 and reduces possible damage to the spacers 113 and the patterned layer 110, which results in improved patterning performance.

Once the pattern of the remaining portions 1102 of the patterned layer 110, spacers 113, and the first film material 122 has been transferred, the remaining portions 1102, the spacers 113, and the first film material 122 may be removed, exposing upper surfaces of the etch stop layer 85, and the first hard mask layer 106. In some embodiments, one or more etching processes, such as one or more wet etches or dry etches, may be utilized to remove the remaining portions 1102, the spacers 113, and the first film material 122. However, any suitable removal process may be utilized.

Figure 12A:
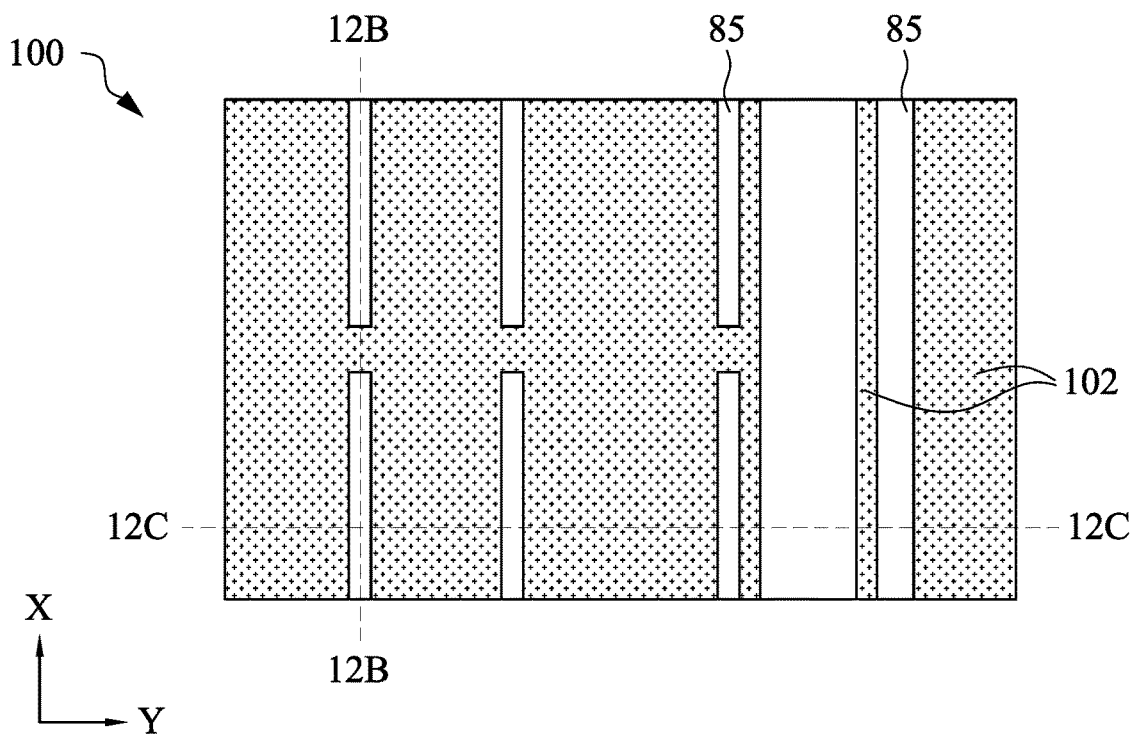
Figure 12B:
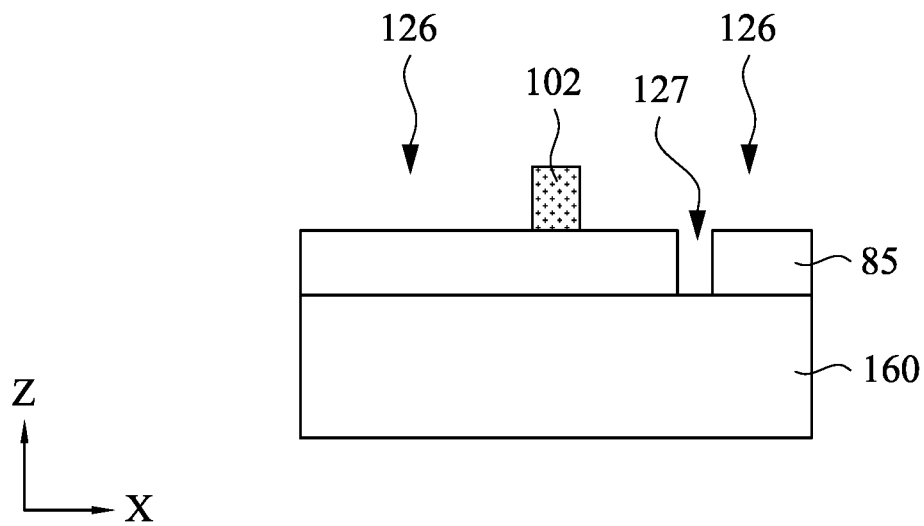
Figure 12C:
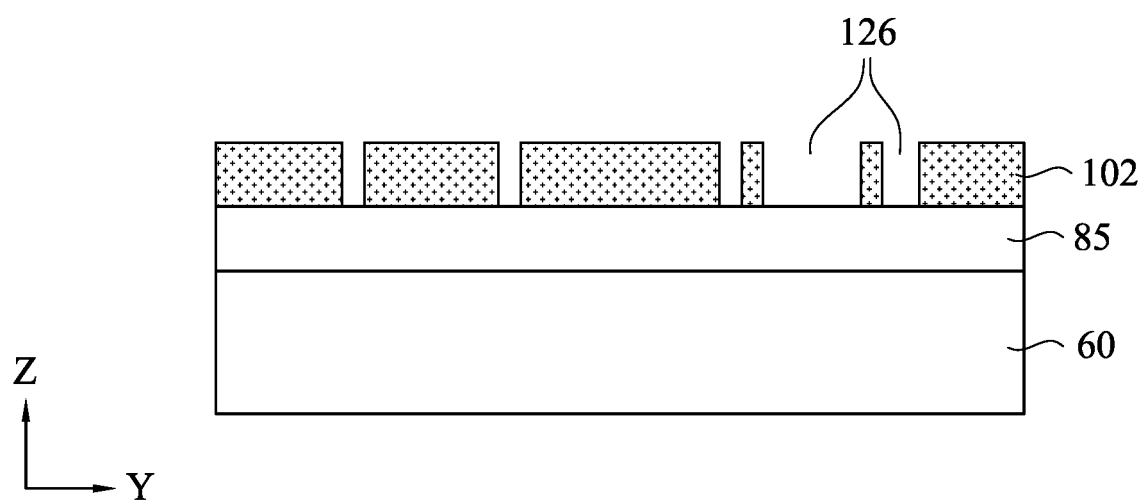

FIGS. 12A through 12C illustrate that once the pattern has been transferred to the first dielectric layer 102, some of the overlying structures may be removed. FIG. 12A shows a top-down view of the semiconductor structure 100 after the removal of the first hard mask layer 106 and the second dielectric layer 104 to expose the top surface of the first dielectric layer 102. FIG. 12B illustrates a cross-sectional view of a portion of the semiconductor structure 100 along line 12B-12B from FIG. 12A. FIG. 12C illustrates a cross-sectional view of a portion of the semiconductor structure 100 along line 12C-12C from FIG. 12A. In some embodiments, the first hard mask layer 106, and the second dielectric layer 104 may each be removed to expose the top surface of the first dielectric layer 102. In some embodiments, the first hard mask layer 106, and the second dielectric layer 104 may be removed using one or more etching processes, such as a series of wet etching processes or dry etching processes. For example, in an embodiment, an etching process may be used that comprises chlorine ($Cl_2$), nitrogen trifluoride ($NF_3$), hydrogen bromide (HBr), or the like, as etching gases to remove the first hard mask layer 106. In an embodiment, an etching process may be used that comprises carbon tetrafluoride ($CF_4$), trifluoromethane ($CHF_3$), hexafluorobutadiene ($C_4F_6$), octafluorocyclobutane ($C_4F_8$) or the like, as etching gases to remove the second dielectric layer 104. However, any suitable combination of etching processes may be utilized.

In an embodiment, openings 127 for conductive vias 129 (shown subsequently in FIG. 14B) are formed through etch stop layer 85 as seen in FIG. 12B. The openings 127 may be formed using acceptable photolithography and etching techniques. The openings 127 may expose underlying conductive features (e.g., underlying interconnect lines, gate contacts, or source/drain contacts) that are electrically coupled to transistors of the active layer (or device region) of the substrate 60.

Figure 13A:
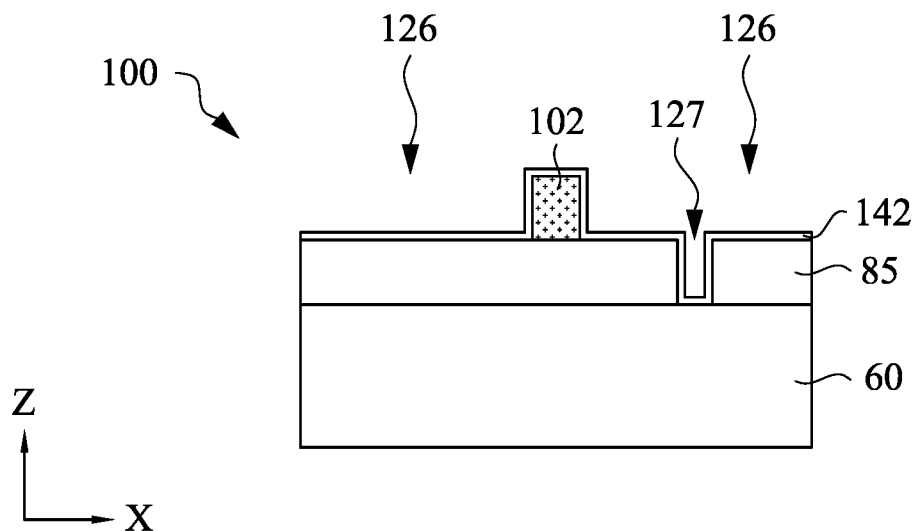
Figure 13B:
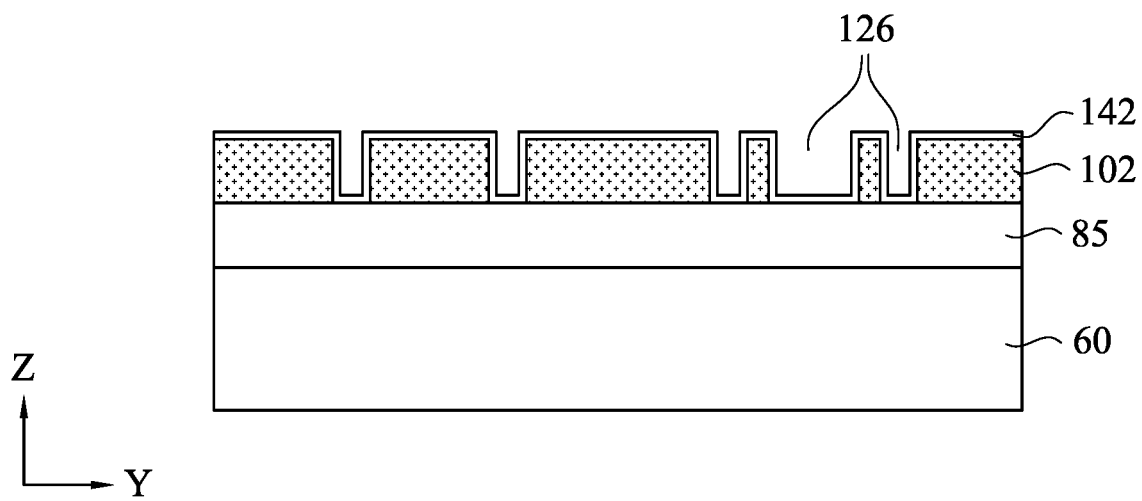

FIGS. 13A and 13B shows that once the first dielectric layer 102 has been patterned and openings 126 and 127 formed, additional processing may be performed to form features in the openings 126 and 127. FIG. 13A illustrates a cross-sectional view of a portion of the semiconductor structure 100 along a line that is similar to line 12B-12B of FIG. 12A. FIG. 13B illustrates a cross-sectional view of a portion of the semiconductor structure 100 along a line that is similar to line 12C-12C of FIG. 12A. In an embodiment in which the first dielectric layer 102 is a low-k dielectric and provides an IMD for an interconnect structure, conductive features such as copper lines, copper vias, and/or cobalt plugs may be formed in the IMD layer and the etch stop layer 85 as illustrated subsequently by FIGS. 14A through 14C so as to form a back-end-of-line (BEOL) interconnect structure that may be used to connect device structures which have been fabricated on the substrate 60 during front-end-of-line (FEOL) processing. In an embodiment, one or more liners 142 may be formed along sidewalls and a bottom surface of the openings 126 and 127. The liners 142 may comprise titanium oxide (TiO), titanium nitride (TiN), tantalum oxide (TaO), tantalum nitride (TaN), or the like and may provide diffusion barrier, adhesion, and/or seed layers for the conductive feature. The liners 142 may be deposited using any suitable process, such as, physical vapor deposition (PVD), chemical vapor deposition (CVD), atomic layer deposition (ALD), and the like.

Figure 14A:
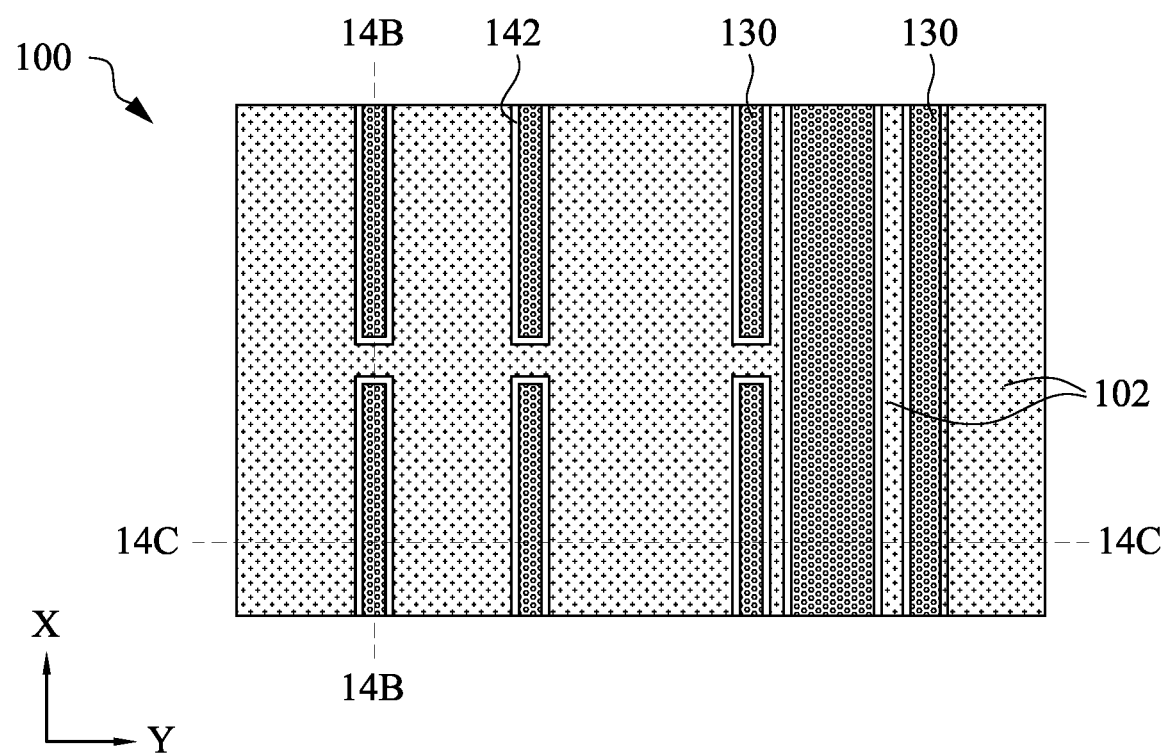
Figure 14B:
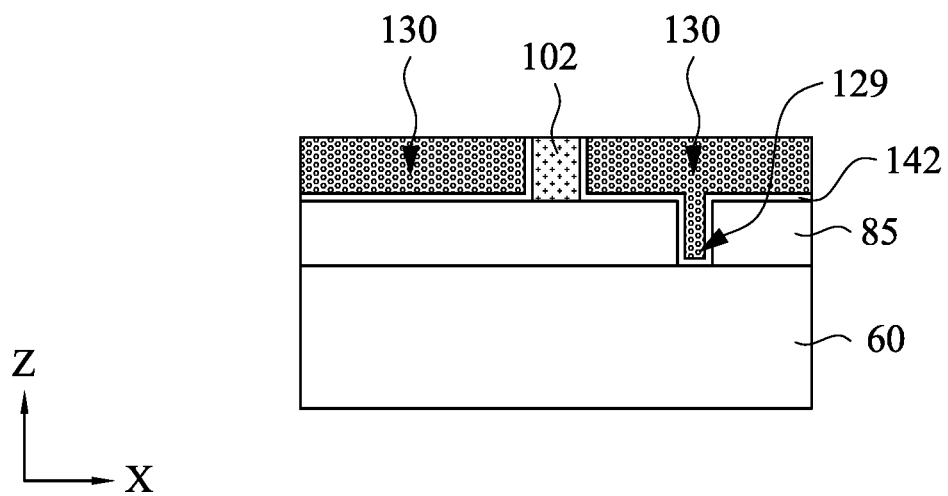
Figure 14C:
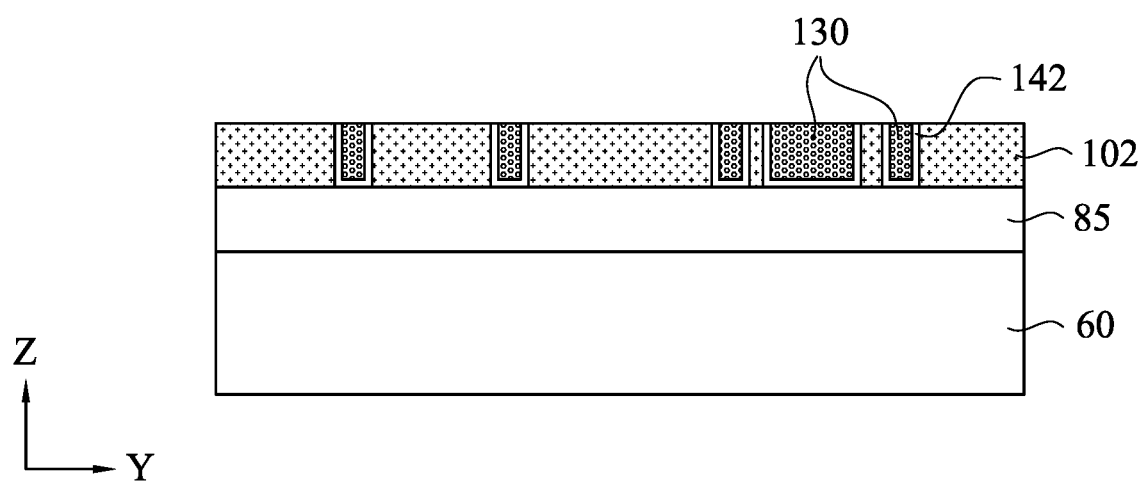

In FIGS. 14A through 14C, a conductive material 130 may be formed over the one or more liners 142 in the openings 126 and 127. FIG. 14A shows a top-down view of the semiconductor structure 100. FIG. 14B illustrates a cross-sectional view of a portion of the semiconductor structure 100 along line 14B-14B from FIG. 14A. FIG. 14C illustrates a cross-sectional view of a portion of the semiconductor structure 100 along line 14C-14C from FIG. 14A. In some embodiments, the conductive material 130 may be a material such as copper, tungsten, aluminum, combinations of these, or the like, that is deposited using a deposition process such as electroplating, electroless plating, chemical vapor deposition (CVD), physical vapor deposition (PVD), atomic layer deposition (ALD), combinations of these, or the like. However, any suitable material and method of manufacture may be utilized.

The conductive material 130 may be deposited to fill and/or overfill the openings 126 in the first dielectric layer 102, as well as the openings 127 in the etch stop layer 85. Once overfilled, a planarization process, such as a chemical mechanical polishing process, may be performed to remove excess portions of the conductive material 130 over the first dielectric layer 102 and to planarize the conductive material 130 to the first dielectric layer 102. However, any suitable planarization process may be utilized. As shown in FIG. 14B, the conductive material 130 in the opening 127 forms the conductive vias 129 that allow for electrical coupling to the gate contacts and source/drain of underlying transistors in the active layer (or device region) of the substrate 60.

The embodiments of the present disclosure have some advantageous features. The embodiments include the formation of a semiconductor device that includes depositing a patterned layer over a dielectric layer, followed by depositing a mask layer over the patterned layer to form a portion of a hard mask. An etching process is then used to pattern the mask layer to form first features (e.g., spacers) in a first (x-axis) direction along sidewalls of the patterned layer and form trenches in the dielectric layer by utilizing the first features and the patterned layer as an etching mask. Portions of the trenches are then filled with a film material that also functions as another portion of the hard mask for subsequent etching operations. One or more embodiments disclosed herein may include allowing for a more uniform topography and controllable height of the film material, and reduction in damage to the first features of the mask layer as a result of less etching exposure. In addition, one or more embodiments disclosed herein may result in a reduction in damage to the patterned layer, thereby allowing for a hard mask that can better pattern underlying layers during the subsequent etching processes. Further, the chemistries of the embodiments are fully compatible with other semiconductor processes, and various embodiments can be manufactured at a relatively low cost.

In accordance with an embodiment, a method for manufacturing a semiconductor device includes depositing a first hard mask layer and a first dielectric layer over a substrate; forming a patterned layer over the first dielectric layer; forming a second hard mask layer over the patterned layer; patterning the second hard mask layer to remove first horizontal portions of the second hard mask layer and leave second portions of the second hard mask layer along sidewalls of the patterned layer; etching a trench in the first dielectric layer using the second portions of the second hard mask layer and the patterned layer as an etching mask; depositing a first gap-filling material in the trench; and patterning the first hard mask layer using the first gap-filling material, the patterned layer, and the second portions of the second hard mask layer as a mask. In an embodiment, patterning the second hard mask layer and etching the trench in the first dielectric layer includes a continuous etching process. In an embodiment, the continuous etching process includes an etchant that includes carbon tetrafluoride ($CF_4$), trifluoromethane ($CHF_3$), difluoromethane ($CH_2F_2$), or hexafluorobutadiene ($C_4F_6$). In an embodiment, the continuous etching process includes flowing a carrier gas that includes nitrogen, helium, or argon. In an embodiment, the first hard mask layer includes tungsten dicarbide, and, where the second hard mask layer includes titanium oxide. In an embodiment, the etch selectivity ratio between the first hard mask layer and the first gap-filling material is higher than 6. In an embodiment, depositing the first gap-filling material in the portion of the trench includes forming a mask layer in the trench and over the patterned layer and the second portions of the second hard mask layer; forming an opening in the mask layer; depositing a gap-filling material in the opening; and reducing the height of the gap-filling material. In an embodiment, depositing the gap-filling material includes forming an oxide using an atomic layer deposition (ALD) process.

In accordance with an embodiment, a method for manufacturing a semiconductor device includes depositing a first dielectric layer over a first hard mask layer; forming a patterned layer over the first dielectric layer; forming spacers along sidewalls of the patterned layer, a first trench being between sidewalls of adjacent ones of the spacers; extending the first trench through the first dielectric layer; depositing a mask layer in the first trench, and over the spacers and the patterned layer; forming an opening in the mask layer, the opening overlapping the first trench; filling the opening with a first gap-filling material; and patterning the first hard mask layer using the spacers, the patterned layer and the first gap-filling material as a mask. In an embodiment, forming the spacers includes forming a second hard mask layer over the patterned layer and the first dielectric layer; etching first portions of the second hard mask layer over the patterned layer; and etching second portions of the second hard mask layer over the first dielectric layer. In an embodiment, forming the spacers and extending the first trench includes a continuous etching process using an etchant that includes carbon tetrafluoride ($CF_4$), trifluoromethane ($CHF_3$), difluoromethane ($CH_2F_2$), or hexafluorobutadiene ($C_4F_6$). In an embodiment, a height of the patterned layer is in a range from 150 Å to 500 Å. In an embodiment, extending the first trench through the first dielectric layer includes exposing a top surface of the first hard mask layer. In an embodiment, filling the opening with the first gap-filling material includes filling first gap-filling material in physical contact with a top surface of the first hard mask layer. In an embodiment, the first dielectric layer includes tetraethyl orthosilicate (TEOS), silicon nitride (SiN), or silicon oxynitride (SiON).

In accordance with an embodiment, a method for manufacturing a semiconductor device includes forming a first hard mask layer over a target layer; forming a first dielectric layer and a patterned layer successively over the first hard mask layer; forming a first portion of a hard mask on sidewalls of the patterned layer; patterning the first dielectric layer to form a trench that extends through the first dielectric layer; depositing a first gap-filling material in the trench to form a second portion of the hard mask; patterning the first hard mask layer using the first portion of the hard mask and the second portion of the hard mask as an etching mask; and transferring the pattern of the first hard mask layer to the target layer. In an embodiment, the first hard mask layer includes a percentage carbon content that is in a range from 40 percent to 60 percent. In an embodiment, the first portion of the hard mask includes titanium oxide, titanium nitride or titanium silicon oxide. In an embodiment, depositing the first gap-filling material in the trench includes depositing the first gap-filling material in physical contact with the first portion of the hard mask, the first hard mask layer, and the first dielectric layer. In an embodiment, depositing the first gap-filling material includes forming a carbon based material using a spin-coating process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device comprising:
   depositing a first hard mask layer and a first dielectric layer over a substrate;
   forming a patterned layer over the first dielectric layer;
   forming a second hard mask layer over the patterned layer;
   patterning the second hard mask layer to remove first horizontal portions of the second hard mask layer and leave second portions of the second hard mask layer along sidewalls of the patterned layer;
   etching the first dielectric layer using the second portions of the second hard mask layer and the patterned layer as an etching mask creating by that a trench that extends through the patterned layer and the first dielectric layer;
   depositing a first gap-filling material in the trench; and
   patterning the first hard mask layer using the first gap-filling material, the patterned layer, and the second portions of the second hard mask layer as a mask.

2. The method of claim 1, wherein patterning the second hard mask layer and etching the trench in the first dielectric layer comprises a continuous etching process.

3. The method of claim 2, wherein the continuous etching process comprises an etchant that includes carbon tetrafluoride ($CF_4$), trifluoromethane ($CHF_3$), difluoromethane ($CH_2F_2$), or hexafluorobutadiene ($C_4F_6$).

4. The method of claim 2, wherein the continuous etching process comprises flowing a carrier gas that includes nitrogen, helium, or argon.

5. The method of claim 1, wherein the first hard mask layer comprises tungsten dicarbide, and, wherein the second hard mask layer comprises titanium oxide.

6. The method of claim 1, wherein the etch selectivity ratio between the first hard mask layer and the first gap-filling material is higher than 6.

7. The method of claim 1, wherein depositing the first gap-filling material in the trench comprises:
   forming a mask layer in the trench and over the patterned layer and the second portions of the second hard mask layer;
   forming an opening in the mask layer, and removing, during this step, a portion of the mask layer that filled the trench;
   depositing the first gap-filling material in the opening, including the trench; and
   reducing the height of the first gap-filling material.

8. The method of claim 7, wherein depositing the first gap-filling material comprises forming an oxide using an atomic layer deposition (ALD) process.

9. A method for manufacturing a semiconductor device comprising:
   depositing a first dielectric layer over a first hard mask layer;
   forming a patterned layer over the first dielectric layer;
   forming spacers along sidewalls of the patterned layer, a first trench being between sidewalls of adjacent ones of the spacers;
   creating an extended first trench by extending the first trench through the first dielectric layer;
   depositing a mask layer in the extended first trench, and over the spacers and the patterned layer;
   forming an opening in the mask layer, the opening passing through the extended first trench;
   filling the extended first trench with a first gap-filling material; and
   patterning the first hard mask layer using the spacers, the patterned layer and the first gap-filling material as a mask.

10. The method of claim 9, wherein forming the spacers comprises:

forming a second hard mask layer over the patterned layer and the first dielectric layer;

etching first portions of the second hard mask layer over the patterned layer; and etching second portions of the second hard mask layer over the first dielectric layer.

11. The method of claim 10, wherein forming the spacers and extending the first trench comprises a continuous etching process using an etchant that includes $CF_4$, $CHF_3$, $CH_2F_2$, or $C_4F_6$.

12. The method of claim 9, wherein a height of the patterned layer is in a range from 150 Å to 500 Å.

13. The method of claim 9, wherein extending the first trench through the first dielectric layer comprises exposing a top surface of the first hard mask layer.

14. The method of claim 9, wherein filling the extended first trench with the first gap-filling material comprises filling first gap-filling material in physical contact with a top surface of the first hard mask layer.

15. The method of claim 9, wherein the first dielectric layer comprises tetetraethyl orthosilicate (TEOS), silicon nitride (SiN), or silicon oxynitride (SiON).

16. A method for manufacturing a semiconductor device comprising:

forming a first hard mask layer over a target layer;

forming a first dielectric layer and a patterned layer successively over the first hard mask layer;

forming a first portion of a hard mask on sidewalls of the patterned layer;

patterning the first dielectric layer and forming a trench that extends through the patterned layer and the first dielectric layer;

depositing a first gap-filling material in the trench to form a second portion of the hard mask;

patterning the first hard mask layer using the first portion of the hard mask and the second portion of the hard mask as parts of an etching mask; and transferring the pattern of the first hard mask layer to the target layer.

17. The method of claim 16 wherein the first hard mask layer comprises a percentage carbon content that is in a range from 40 percent to 60 percent.

18. The method of claim 16, wherein the first portion of the hard mask comprises titanium oxide, titanium nitride or titanium silicon oxide.

19. The method of claim 16, wherein depositing the first gap-filling material in the trench comprises depositing the first gap-filling material in physical contact with the first portion of the hard mask, the first hard mask layer, and the first dielectric layer.

20. The method of claim 16, wherein depositing the first gap-filling material comprises forming a carbon based material using a spin-coating process.

* * * * *